(12) United States Patent
Coe-Sullivan et al.

(10) Patent No.: US 10,145,539 B2
(45) Date of Patent: *Dec. 4, 2018

(54) SOLID STATE LIGHTING DEVICES INCLUDING QUANTUM CONFINED SEMICONDUCTOR NANOPARTICLES, AN OPTICAL COMPONENT FOR A SOLID STATE LIGHTING DEVICE, AND METHODS

(71) Applicant: SAMSUNG ELECTRONICS CO., LTD., Suwon-si (KR)

(72) Inventors: Seth Coe-Sullivan, Redondo Beach, CA (US); John R. Linton, Concord, MA (US); Sridhar Sadasivan, Concord, MA (US); Emily M. Squires, Littleton, MA (US); Moungi G. Bawendi, Cambridge, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/886,867

(22) Filed: Oct. 19, 2015

(65) Prior Publication Data
US 2016/0209002 A1 Jul. 21, 2016

Related U.S. Application Data

(63) Continuation of application No. 12/940,355, filed on Nov. 5, 2010, now Pat. No. 9,167,659, which is a
(Continued)

(51) Int. Cl.
*F21V 9/16* (2006.01)
*F21V 3/04* (2018.01)
(Continued)

(52) U.S. Cl.
CPC .............. *F21V 9/16* (2013.01); *F21V 3/0445* (2013.01); *F21V 3/0463* (2013.01);
(Continued)

(58) Field of Classification Search
CPC ........ F21V 9/16; F21V 3/0427; F21V 3/0445; F21V 3/0463; F21V 3/0481; H01L 33/502; H01L 2933/0091; H05B 33/145
See application file for complete search history.

(56) References Cited

U.S. PATENT DOCUMENTS

| 4,035,686 A | 7/1977 | Fleming |
| 4,130,343 A | 12/1978 | Miller et al. |

(Continued)

FOREIGN PATENT DOCUMENTS

| JP | 1260707 | 10/1989 |
| JP | H09304623 | 11/1997 |

(Continued)

OTHER PUBLICATIONS

Notice of Allowance dated Apr. 5, 2017 of the corresponding Korean Patent Application No. 10-2011-7028142.
(Continued)

*Primary Examiner* — Alan Cariaso
(74) *Attorney, Agent, or Firm* — Cantor Colburn LLP

(57) ABSTRACT

A solid state lighting device including a light source capable of emitting white light including a blue spectral component and having a deficiency in a spectral region, and an optical component that is positioned to receive at least a portion of the light generated by the light source, the optical component comprising an optical material for converting at least a portion of the blue spectral component of the light to one or more predetermined wavelengths such that light emitted by the solid state lighting device includes light emission from the light source supplemented with light emission at one or (Continued)

more predetermined wavelengths, wherein the optical material comprises quantum confined semiconductor nanoparticles. Also disclosed is lighting fixture, a cover plate for a lighting fixture and a method.

20 Claims, 2 Drawing Sheets

Related U.S. Application Data continuation of application No. PCT/US2009/002789, filed on May 6, 2009.

(60) Provisional application No. 61/050,929, filed on May 6, 2008, provisional application No. 61/162,293, filed on Mar. 21, 2009, provisional application No. 61/173,375, filed on Apr. 28, 2009, provisional application No. 61/175,430, filed on May 4, 2009.

(51) Int. Cl.
 *H01L 33/50* (2010.01)
 *H05B 33/14* (2006.01)
 *F21Y 115/10* (2016.01)

(52) U.S. Cl.
 CPC ......... *H01L 33/502* (2013.01); *H05B 33/145* (2013.01); *F21V 3/0481* (2013.01); *F21Y 2115/10* (2016.08); *H01L 2933/0091* (2013.01)

(56) References Cited

U.S. PATENT DOCUMENTS

| | | |
|---|---|---|
| 4,382,272 A | 5/1983 | Quella et al. |
| 4,608,301 A | 8/1986 | Ishizuka et al. |
| 4,652,464 A | 3/1987 | Ludlum et al. |
| 4,701,276 A | 10/1987 | Wyman |
| 4,719,386 A | 1/1988 | Toho |
| 4,738,798 A | 4/1988 | Mahler |
| 4,766,528 A | 8/1988 | Morimoto et al. |
| 4,820,016 A | 4/1989 | Cohen et al. |
| 4,929,053 A | 5/1990 | Muller-Stute et al. |
| 5,064,718 A | 11/1991 | Buscall et al. |
| 5,077,147 A | 12/1991 | Tanaka et al. |
| 5,091,115 A | 2/1992 | Nogami et al. |
| 5,132,051 A | 7/1992 | Herron |
| 5,187,765 A | 2/1993 | Muehlemann et al. |
| 5,260,957 A | 11/1993 | Hakimi et al. |
| 5,354,707 A | 10/1994 | Chapple-Sokol et al. |
| 5,422,489 A | 6/1995 | Bhargava |
| 5,434,878 A | 7/1995 | Lawandy |
| 5,442,254 A | 8/1995 | Jaskie |
| 5,455,489 A | 10/1995 | Bhargava |
| 5,470,910 A | 11/1995 | Spanhel et al. |
| 5,504,661 A | 4/1996 | Szpak |
| 5,505,928 A | 4/1996 | Alivisatos et al. |
| 5,527,386 A | 6/1996 | Statz |
| 5,534,056 A | 7/1996 | Kuehule et al. |
| 5,557,436 A | 9/1996 | Blose et al. |
| 5,586,879 A | 12/1996 | Szpak |
| 5,599,897 A | 2/1997 | Nishiguchi et al. |
| 5,716,679 A | 2/1998 | Krug et al. |
| 5,717,289 A | 2/1998 | Tanaka |
| 5,777,433 A | 7/1998 | Lester et al. |
| 5,813,753 A | 9/1998 | Vriens et al. |
| 5,847,507 A | 12/1998 | Butterworth et al. |
| 5,881,200 A | 3/1999 | Burt |
| 5,882,779 A | 3/1999 | Lawandy |
| 5,909,081 A | 6/1999 | Eida et al. |
| 5,917,279 A | 6/1999 | Eischner et al. |
| 5,955,528 A | 9/1999 | Sato et al. |
| 5,955,837 A | 9/1999 | Horikx et al. |
| 5,959,316 A | 9/1999 | Lowery et al. |
| 5,962,971 A | 10/1999 | Chen |
| 5,975,711 A | 11/1999 | Parker et al. |
| 5,982,092 A | 11/1999 | Chen |
| 5,988,822 A | 11/1999 | Abe et al. |
| 5,998,925 A | 12/1999 | Shimizu et al. |
| 6,005,707 A | 12/1999 | Berggren et al. |
| 6,023,371 A | 2/2000 | Onitsuka et al. |
| 6,048,616 A | 4/2000 | Gallagher et al. |
| 6,066,861 A | 5/2000 | Hohn et al. |
| 6,069,440 A | 5/2000 | Shimizu et al. |
| 6,069,442 A | 5/2000 | Hung et al. |
| 6,114,038 A * | 9/2000 | Castro ..................... B82Y 5/00 257/614 |
| 6,117,529 A | 9/2000 | Leising et al. |
| 6,236,493 B1 | 5/2001 | Schmidt et al. |
| 6,249,372 B1 | 6/2001 | Kobayashi et al. |
| 6,259,506 B1 | 7/2001 | Lawandy |
| 6,319,426 B1 | 11/2001 | Bawendi et al. |
| 6,322,901 B1 | 11/2001 | Bawendi et al. |
| 6,340,824 B1 | 1/2002 | Komoto et al. |
| 6,357,889 B1 | 3/2002 | Duggal et al. |
| 6,358,652 B1 | 3/2002 | Tomiuchi et al. |
| 6,422,712 B1 | 7/2002 | Nousiainen et al. |
| 6,464,898 B1 | 10/2002 | Tomoike et al. |
| 6,473,554 B1 | 10/2002 | Pelka et al. |
| 6,482,664 B1 | 11/2002 | Kanekiyo |
| 6,501,091 B1 | 12/2002 | Bawendi et al. |
| 6,548,168 B1 | 4/2003 | Mulvaney et al. |
| 6,548,834 B2 | 4/2003 | Sugawara |
| 6,565,770 B1 | 5/2003 | Mayer et al. |
| 6,576,155 B1 | 6/2003 | Barbera-Guillem |
| 6,576,291 B2 | 6/2003 | Bawendi et al. |
| 6,576,930 B2 | 6/2003 | Reeh et al. |
| 6,577,073 B2 | 6/2003 | Shimizu et al. |
| 6,586,096 B2 | 7/2003 | Border et al. |
| 6,600,175 B1 | 7/2003 | Baretz et al. |
| 6,608,332 B2 | 8/2003 | Shimizu et al. |
| 6,608,439 B1 | 8/2003 | Sokolik et al. |
| 6,613,247 B1 | 9/2003 | Hohn et al. |
| 6,637,905 B1 | 10/2003 | Ng et al. |
| 6,637,924 B2 | 10/2003 | Pelka et al. |
| 6,639,733 B2 | 10/2003 | Minano et al. |
| 6,641,755 B2 | 11/2003 | Tomoike et al. |
| 6,642,552 B2 | 11/2003 | Stern |
| 6,650,044 B1 | 11/2003 | Lowery |
| 6,653,778 B1 | 11/2003 | Tomluchi et al. |
| 6,677,610 B2 | 1/2004 | Choi et al. |
| 6,703,781 B2 | 3/2004 | Zovko |
| 6,710,366 B1 | 3/2004 | Lee et al. |
| 6,710,911 B2 | 3/2004 | Locascio et al. |
| 6,714,711 B1 | 3/2004 | Lieberman et al. |
| 6,731,359 B1 | 5/2004 | Fukaya |
| 6,734,465 B1 | 5/2004 | Taskar et al. |
| 6,744,077 B2 | 6/2004 | Trottier et al. |
| 6,744,960 B2 | 6/2004 | Pelka |
| 6,777,531 B2 | 8/2004 | Yasuda et al. |
| 6,777,706 B1 | 8/2004 | Tessler et al. |
| 6,781,148 B2 | 8/2004 | Kubota et al. |
| 6,784,603 B2 | 8/2004 | Pelka |
| 6,791,259 B1 | 9/2004 | Stokes et al. |
| 6,794,686 B2 | 9/2004 | Chang et al. |
| 6,801,270 B2 | 10/2004 | Faris et al. |
| 6,803,719 B1 | 10/2004 | Miller et al. |
| 6,812,500 B2 | 11/2004 | Reeh et al. |
| 6,819,692 B2 | 11/2004 | Klimov et al. |
| 6,819,845 B2 | 11/2004 | Lee et al. |
| 6,821,559 B2 | 11/2004 | Eberspacher et al. |
| 6,830,835 B2 | 12/2004 | Saito et al. |
| 6,835,326 B2 | 12/2004 | Barbera-Guillem |
| 6,838,743 B2 | 1/2005 | Yamada et al. |
| 6,849,109 B2 | 2/2005 | Yadav et al. |
| 6,864,626 B1 | 3/2005 | Weiss et al. |
| 6,869,545 B2 | 3/2005 | Peng et al. |
| 6,876,796 B2 | 4/2005 | Garito et al. |
| 6,885,033 B2 | 4/2005 | Andrews |
| 6,891,330 B2 | 5/2005 | Duggal et al. |
| 6,903,505 B2 | 6/2005 | McNulty et al. |
| 6,913,830 B2 | 7/2005 | Decker et al. |
| 6,914,106 B2 | 7/2005 | Leon et al. |
| 6,924,596 B2 | 8/2005 | Sato et al. |

(56) References Cited

U.S. PATENT DOCUMENTS

| | | | |
|---|---|---|---|
| 6,957,608 B1 | 10/2005 | Hubert et al. | |
| 6,961,105 B2 | 11/2005 | Chang et al. | |
| 7,005,667 B2 | 2/2006 | Chen et al. | |
| 7,005,669 B1 | 2/2006 | Lee | |
| 7,008,559 B2 | 3/2006 | Chen | |
| 7,040,774 B2 | 5/2006 | Beeson et al. | |
| 7,042,020 B2 | 5/2006 | Negley | |
| 7,045,956 B2 | 5/2006 | Braune et al. | |
| 7,046,439 B2 | 5/2006 | Kaminsky et al. | |
| 7,065,285 B2 | 6/2006 | Chen et al. | |
| 7,066,623 B2 | 6/2006 | Lee et al. | |
| 7,068,898 B2 | 6/2006 | Buretea et al. | |
| 7,070,300 B2 | 7/2006 | Harbers et al. | |
| 7,071,616 B2 | 7/2006 | Shimizu et al. | |
| 7,075,225 B2 | 7/2006 | Baroky et al. | |
| 7,078,732 B1 | 7/2006 | Reeh et al. | |
| 7,090,355 B2 | 8/2006 | Liu et al. | |
| 7,091,653 B2 | 8/2006 | Ouderkirk et al. | |
| 7,091,656 B2 | 8/2006 | Murazaki et al. | |
| 7,102,152 B2 | 9/2006 | Chua et al. | |
| 7,108,416 B1 | 9/2006 | Osawa | |
| 7,110,299 B2 | 9/2006 | Forbes | |
| 7,123,796 B2 | 10/2006 | Steckl et al. | |
| 7,126,162 B2 | 10/2006 | Reeh et al. | |
| 7,129,515 B2 | 10/2006 | Okuyama et al. | |
| 7,135,816 B2 | 11/2006 | Kawaguchi et al. | |
| 7,144,131 B2 | 12/2006 | Rains | |
| 7,160,613 B2 | 1/2007 | Bawendi et al. | |
| 7,166,010 B2 | 1/2007 | Lamansky et al. | |
| 7,168,833 B2 | 1/2007 | Schottland et al. | |
| 7,172,811 B2 | 2/2007 | Denisyuk et al. | |
| 7,175,948 B2 | 2/2007 | Yoshihara et al. | |
| 7,189,768 B2 | 3/2007 | Baran et al. | |
| 7,196,354 B1 | 3/2007 | Erchak et al. | |
| 7,199,393 B2 | 4/2007 | Park et al. | |
| 7,213,940 B2 | 5/2007 | Van De Ven et al. | |
| 7,226,856 B1 | 6/2007 | Lopatin et al. | |
| 7,235,792 B2 | 6/2007 | Elofson | |
| 7,239,080 B2 | 7/2007 | Ng et al. | |
| 7,242,030 B2 | 7/2007 | Wang et al. | |
| 7,245,065 B2 | 7/2007 | Ghosh et al. | |
| 7,253,452 B2 | 8/2007 | Steckel et al. | |
| 7,259,400 B1 * | 8/2007 | Taskar | H01L 33/502 257/79 |
| 7,264,527 B2 | 9/2007 | Bawendi et al. | |
| 7,273,309 B2 | 9/2007 | Ford et al. | |
| 7,279,716 B2 | 10/2007 | Chen | |
| 7,279,832 B2 | 10/2007 | Thurk et al. | |
| 7,294,861 B2 | 11/2007 | Schardt et al. | |
| 7,318,651 B2 | 1/2008 | Chua et al. | |
| 7,321,193 B2 | 1/2008 | Antoniadis et al. | |
| 7,326,365 B2 | 2/2008 | Bawendi et al. | |
| 7,329,371 B2 | 2/2008 | Setlur et al. | |
| 7,350,933 B2 | 4/2008 | Ng et al. | |
| 7,364,925 B2 | 4/2008 | Lee et al. | |
| 7,374,807 B2 | 5/2008 | Parce et al. | |
| 7,390,568 B2 | 6/2008 | Kim et al. | |
| 7,393,618 B2 | 7/2008 | Ioku et al. | |
| 7,420,323 B2 | 9/2008 | Krummacher | |
| 7,430,355 B2 | 9/2008 | Heikenfeld et al. | |
| 7,459,145 B2 | 12/2008 | Bao et al. | |
| 7,462,502 B2 | 12/2008 | Paolini et al. | |
| 7,462,984 B2 | 12/2008 | Handa et al. | |
| 7,466,885 B2 | 12/2008 | Gugel | |
| 7,473,922 B2 | 1/2009 | Uchiyama et al. | |
| 7,473,939 B2 | 1/2009 | Wu et al. | |
| 7,481,562 B2 | 1/2009 | Chua et al. | |
| 7,488,101 B2 | 2/2009 | Brukilacchio | |
| 7,495,383 B2 | 2/2009 | Chua et al. | |
| 7,496,259 B2 | 2/2009 | Karasawa | |
| 7,497,581 B2 | 3/2009 | Beeson et al. | |
| 7,513,669 B2 | 4/2009 | Chua et al. | |
| 7,522,647 B2 | 4/2009 | Hatori et al. | |
| 7,535,524 B2 | 5/2009 | Chua et al. | |
| 7,546,013 B1 | 6/2009 | Santori et al. | |
| 7,553,683 B2 | 6/2009 | Martin et al. | |
| 7,554,257 B2 | 6/2009 | Krummacher et al. | |
| 7,560,747 B2 | 7/2009 | Cok | |
| 7,560,859 B2 | 7/2009 | Saito et al. | |
| 7,592,618 B2 | 9/2009 | Khang et al. | |
| 7,595,508 B2 | 9/2009 | Otsubo et al. | |
| 7,614,759 B2 | 11/2009 | Negley | |
| 7,645,397 B2 | 1/2010 | Parce et al. | |
| 7,679,102 B2 | 3/2010 | Chik et al. | |
| 7,682,850 B2 | 3/2010 | Harbers et al. | |
| 7,686,493 B2 | 3/2010 | Roshan et al. | |
| 7,692,373 B2 | 4/2010 | Bawendi et al. | |
| 7,695,150 B2 | 4/2010 | Dejima et al. | |
| 7,703,942 B2 | 4/2010 | Narendran et al. | |
| 7,710,026 B2 | 5/2010 | Cok et al. | |
| 7,719,016 B2 | 5/2010 | Nada et al. | |
| 7,722,422 B2 | 5/2010 | Cok | |
| 7,723,744 B2 | 5/2010 | Gillies et al. | |
| 7,732,237 B2 | 6/2010 | Xie | |
| 7,732,823 B2 | 6/2010 | Kawaguchi | |
| 7,750,359 B2 | 7/2010 | Narendran et al. | |
| 7,750,425 B2 | 7/2010 | Forrest et al. | |
| 7,772,551 B2 | 8/2010 | Todori et al. | |
| 7,791,092 B2 | 9/2010 | Tarsa et al. | |
| 7,791,271 B2 | 9/2010 | Cok | |
| 7,795,609 B2 | 9/2010 | Huffaker et al. | |
| 7,813,160 B2 | 10/2010 | Drndic et al. | |
| 7,819,539 B2 | 10/2010 | Kim et al. | |
| 7,834,372 B2 * | 11/2010 | Zhai | F21V 3/00 257/100 |
| 7,837,348 B2 | 11/2010 | Narendran et al. | |
| 7,842,385 B2 | 11/2010 | Jang et al. | |
| 7,847,302 B2 | 12/2010 | Basin et al. | |
| 7,850,777 B2 * | 12/2010 | Peng | B82Y 30/00 117/68 |
| 7,858,408 B2 | 12/2010 | Mueller et al. | |
| 7,880,377 B2 | 2/2011 | Orita et al. | |
| 7,884,384 B2 | 2/2011 | Chung et al. | |
| 7,898,665 B2 * | 3/2011 | Brukilacchio | A61B 1/0653 356/417 |
| 7,901,111 B2 | 3/2011 | Negley | |
| 7,902,748 B2 | 3/2011 | Cok | |
| 7,952,105 B2 | 5/2011 | Cok | |
| 7,969,085 B2 | 6/2011 | Cok | |
| 7,982,396 B2 | 7/2011 | Cok | |
| 7,989,153 B2 | 8/2011 | Skipor et al. | |
| 8,021,008 B2 * | 9/2011 | Ramer | F21V 14/003 257/98 |
| 8,033,706 B1 | 10/2011 | Kelly et al. | |
| 8,044,414 B2 | 10/2011 | Hori et al. | |
| 8,076,410 B2 * | 12/2011 | Nayfeh | C09K 11/02 252/301.36 |
| 8,084,934 B2 | 12/2011 | Kim et al. | |
| 8,128,249 B2 | 3/2012 | Skipor et al. | |
| 8,174,181 B2 | 5/2012 | Bawendi et al. | |
| 8,237,154 B2 | 8/2012 | Jang et al. | |
| 8,288,943 B2 | 10/2012 | Ansems et al. | |
| 8,294,156 B2 | 10/2012 | Jang et al. | |
| 8,343,575 B2 | 1/2013 | Dubrow | |
| 8,353,613 B2 | 1/2013 | Choi et al. | |
| 8,360,617 B2 | 1/2013 | Gillies et al. | |
| 8,399,900 B2 | 3/2013 | Hartmann | |
| 8,403,531 B2 * | 3/2013 | Negley | H05B 33/0803 362/249.02 |
| 8,405,063 B2 | 3/2013 | Kazlas et al. | |
| 8,427,855 B2 | 4/2013 | Jang et al. | |
| 8,569,949 B2 | 10/2013 | Lenk et al. | |
| 8,618,561 B2 | 12/2013 | Coe-Sullivan | |
| 8,642,977 B2 | 2/2014 | Comerford et al. | |
| 8,684,559 B2 | 4/2014 | Van De Ven et al. | |
| 8,718,437 B2 | 5/2014 | Coe-Sullivan et al. | |
| 8,759,850 B2 | 6/2014 | Coe-Sullivan et al. | |
| 9,096,425 B2 | 8/2015 | Coe-Sullivan et al. | |
| 9,167,659 B2 * | 10/2015 | Coe-Sullivan | H01L 33/502 |
| 2001/0028055 A1 | 10/2001 | Fafard et al. | |
| 2002/0021003 A1 | 2/2002 | McGrew | |
| 2002/0053359 A1 | 5/2002 | Harman et al. | |
| 2002/0071948 A1 | 6/2002 | Duff et al. | |
| 2002/0127224 A1 | 9/2002 | Chen | |

(56) References Cited

U.S. PATENT DOCUMENTS

| | | |
|---|---|---|
| 2002/0136932 A1 | 9/2002 | Yoshida et al. |
| 2002/0157574 A1 | 10/2002 | Weitzel et al. |
| 2002/0186921 A1 | 12/2002 | Schumacher et al. |
| 2003/0010987 A1 | 1/2003 | Banin et al. |
| 2003/0030706 A1 | 2/2003 | Jagannathan et al. |
| 2003/0044114 A1 | 3/2003 | Pelka |
| 2003/0048346 A1 | 3/2003 | Chow |
| 2003/0059635 A1 | 3/2003 | Naasani |
| 2003/0091933 A1 | 5/2003 | Kunita |
| 2003/0142944 A1 | 7/2003 | Sundar et al. |
| 2003/0151700 A1 | 8/2003 | Carter et al. |
| 2003/0156425 A1 | 8/2003 | Turnbull et al. |
| 2003/0175004 A1 | 9/2003 | Garito et al. |
| 2003/0180029 A1 | 9/2003 | Garito et al. |
| 2003/0194578 A1* | 10/2003 | Tam .................. D01D 5/24 428/690 |
| 2003/0227249 A1 | 12/2003 | Mueller et al. |
| 2004/0007169 A1 | 1/2004 | Ohtsu et al. |
| 2004/0012083 A1 | 1/2004 | Farrell et al. |
| 2004/0023010 A1 | 2/2004 | Bulovic et al. |
| 2004/0091710 A1 | 5/2004 | Bawendi et al. |
| 2004/0110002 A1 | 6/2004 | Kim et al. |
| 2004/0135495 A1 | 7/2004 | Wu et al. |
| 2004/0145289 A1 | 7/2004 | Ouderkirk et al. |
| 2004/0146560 A1 | 7/2004 | Whiteford et al. |
| 2004/0174715 A1 | 9/2004 | Page et al. |
| 2004/0178338 A1 | 9/2004 | Empedocles et al. |
| 2004/0201664 A1 | 10/2004 | Bringley et al. |
| 2004/0203170 A1 | 10/2004 | Barbera-Gulliem |
| 2004/0233139 A1 | 11/2004 | Asano et al. |
| 2004/0245912 A1 | 12/2004 | Thurk et al. |
| 2004/0262583 A1 | 12/2004 | Lee |
| 2005/0002635 A1 | 1/2005 | Banin et al. |
| 2005/0012076 A1 | 1/2005 | Morioka |
| 2005/0051777 A1 | 3/2005 | Hill |
| 2005/0058416 A1 | 3/2005 | Lee et al. |
| 2005/0088079 A1 | 4/2005 | Daniels |
| 2005/0093422 A1 | 5/2005 | Wang et al. |
| 2005/0098787 A1 | 5/2005 | Andrews |
| 2005/0111805 A1 | 5/2005 | Hertz et al. |
| 2005/0126628 A1 | 6/2005 | Scher et al. |
| 2005/0129947 A1 | 6/2005 | Peng et al. |
| 2005/0134723 A1 | 6/2005 | Lee et al. |
| 2005/0135079 A1 | 6/2005 | Yin Chua et al. |
| 2005/0139852 A1 | 6/2005 | Chen et al. |
| 2005/0142343 A1 | 6/2005 | Winker et al. |
| 2005/0157996 A1 | 7/2005 | McCarthy et al. |
| 2005/0164227 A1 | 7/2005 | Ogura et al. |
| 2005/0180680 A1 | 8/2005 | Kong |
| 2005/0185686 A1 | 8/2005 | Rupasov et al. |
| 2005/0200269 A1 | 9/2005 | Ng et al. |
| 2005/0212405 A1 | 9/2005 | Negely |
| 2005/0214967 A1 | 9/2005 | Scher et al. |
| 2005/0218377 A1 | 10/2005 | Lawandy |
| 2005/0236556 A1 | 10/2005 | Sargent et al. |
| 2005/0254258 A1 | 11/2005 | Lee |
| 2005/0258418 A1 | 11/2005 | Steckel et al. |
| 2005/0261400 A1 | 11/2005 | Yang et al. |
| 2005/0265404 A1 | 12/2005 | Ashdown |
| 2005/0266246 A1 | 12/2005 | Reiss et al. |
| 2005/0272159 A1 | 12/2005 | Ismagilov et al. |
| 2005/0275615 A1 | 12/2005 | Karen et al. |
| 2005/0279949 A1 | 12/2005 | Oldham et al. |
| 2006/0001036 A1 | 1/2006 | Jacob et al. |
| 2006/0002101 A1 | 1/2006 | Wheatley et al. |
| 2006/0003097 A1 | 1/2006 | Andres et al. |
| 2006/0003114 A1 | 1/2006 | Enlow et al. |
| 2006/0034065 A1 | 2/2006 | Thurk |
| 2006/0038182 A1 | 2/2006 | Rogers et al. |
| 2006/0040103 A1 | 2/2006 | Whiteford et al. |
| 2006/0043361 A1 | 3/2006 | Lee et al. |
| 2006/0057480 A1 | 3/2006 | Lin et al. |
| 2006/0060862 A1 | 3/2006 | Bawendi et al. |
| 2006/0063029 A1 | 3/2006 | Jang et al. |
| 2006/0063289 A1 | 3/2006 | Negley et al. |
| 2006/0066210 A1 | 3/2006 | Ng et al. |
| 2006/0067602 A1 | 3/2006 | Todori et al. |
| 2006/0068154 A1 | 3/2006 | Parce et al. |
| 2006/0069314 A1 | 3/2006 | Farr |
| 2006/0071218 A1 | 4/2006 | Takeda et al. |
| 2006/0081862 A1 | 4/2006 | Chua et al. |
| 2006/0097624 A1 | 5/2006 | Murase et al. |
| 2006/0103589 A1 | 5/2006 | Chua et al. |
| 2006/0105481 A1 | 5/2006 | Boardman et al. |
| 2006/0105483 A1 | 5/2006 | Leatherdale et al. |
| 2006/0109682 A1 | 5/2006 | Ko et al. |
| 2006/0113895 A1 | 6/2006 | Baroky et al. |
| 2006/0128845 A1 | 6/2006 | Emrick et al. |
| 2006/0145599 A1 | 7/2006 | Stegamat et al. |
| 2006/0146565 A1 | 7/2006 | Lee |
| 2006/0147703 A1 | 7/2006 | Walker et al. |
| 2006/0157686 A1 | 7/2006 | Jang et al. |
| 2006/0157720 A1 | 7/2006 | Bawendi et al. |
| 2006/0157721 A1 | 7/2006 | Tran et al. |
| 2006/0160162 A1 | 7/2006 | Fulwyler et al. |
| 2006/0169971 A1 | 8/2006 | Cho et al. |
| 2006/0196375 A1 | 9/2006 | Coe-Sullivan et al. |
| 2006/0197059 A1 | 9/2006 | Kram et al. |
| 2006/0197437 A1 | 9/2006 | Krummacher et al. |
| 2006/0199886 A1 | 9/2006 | Ryang |
| 2006/0204676 A1 | 9/2006 | Jones et al. |
| 2006/0204679 A1 | 9/2006 | Jones et al. |
| 2006/0210726 A1 | 9/2006 | Jones et al. |
| 2006/0214903 A1 | 9/2006 | Kurosaka |
| 2006/0215958 A1 | 9/2006 | Yeo et al. |
| 2006/0216508 A1 | 9/2006 | Denisyuk et al. |
| 2006/0216759 A1 | 9/2006 | Naasani et al. |
| 2006/0221021 A1 | 10/2006 | Hajjar et al. |
| 2006/0227546 A1 | 10/2006 | Yeo et al. |
| 2006/0238671 A1 | 10/2006 | Kim et al. |
| 2006/0244358 A1 | 11/2006 | Kim et al. |
| 2006/0255713 A1 | 11/2006 | Kondo et al. |
| 2006/0268571 A1 | 11/2006 | Harada et al. |
| 2006/0291252 A1 | 12/2006 | Lim et al. |
| 2007/0001581 A1 | 1/2007 | Stasiak et al. |
| 2007/0012928 A1 | 1/2007 | Peng et al. |
| 2007/0012941 A1 | 1/2007 | Cheon |
| 2007/0013996 A1 | 1/2007 | Verma |
| 2007/0014318 A1 | 1/2007 | Hajjar et al. |
| 2007/0018102 A1 | 1/2007 | Braune et al. |
| 2007/0018558 A1 | 1/2007 | Chua et al. |
| 2007/0034833 A1 | 2/2007 | Parce et al. |
| 2007/0036962 A1 | 2/2007 | Sasaki et al. |
| 2007/0053208 A1 | 3/2007 | Justel et al. |
| 2007/0072979 A1 | 3/2007 | Moad et al. |
| 2007/0085092 A1 | 4/2007 | Chen |
| 2007/0090755 A1 | 4/2007 | Eida et al. |
| 2007/0096078 A1 | 5/2007 | Lee et al. |
| 2007/0096634 A1 | 5/2007 | Krummacher |
| 2007/0098160 A1 | 5/2007 | Labians |
| 2007/0103068 A1 | 5/2007 | Bawendi et al. |
| 2007/0108888 A1 | 5/2007 | Chen et al. |
| 2007/0112097 A1 | 5/2007 | Olson et al. |
| 2007/0112101 A1 | 5/2007 | Choi et al. |
| 2007/0112118 A1 | 5/2007 | Park et al. |
| 2007/0115995 A1 | 5/2007 | Kim et al. |
| 2007/0119951 A1 | 5/2007 | Auslander et al. |
| 2007/0121129 A1 | 5/2007 | Eida et al. |
| 2007/0131905 A1 | 6/2007 | Sato et al. |
| 2007/0138932 A1 | 6/2007 | Morioka et al. |
| 2007/0145350 A1 | 6/2007 | Kobori |
| 2007/0012355 A1 | 7/2007 | Locascio et al. |
| 2007/0158668 A1 | 7/2007 | Tarsa et al. |
| 2007/0164661 A1 | 7/2007 | Kuma et al. |
| 2007/0170418 A1 | 7/2007 | Bowers et al. |
| 2007/0170447 A1 | 7/2007 | Negley et al. |
| 2007/0171188 A1 | 7/2007 | Waites |
| 2007/0177380 A1 | 8/2007 | Schultz et al. |
| 2007/0190675 A1 | 8/2007 | Yamazaki et al. |
| 2007/0200479 A1 | 8/2007 | Jean et al. |
| 2007/0200492 A1 | 8/2007 | Cok et al. |
| 2007/0201056 A1 | 8/2007 | Cok et al. |
| 2007/0223219 A1 | 9/2007 | Medendrop et al. |
| 2007/0235751 A1 | 10/2007 | Radkov et al. |

(56) References Cited

U.S. PATENT DOCUMENTS

| | | |
|---|---|---|
| 2007/0241661 A1 | 10/2007 | Yin |
| 2007/0246734 A1 | 10/2007 | Lee et al. |
| 2007/0262294 A1 | 11/2007 | Peterson et al. |
| 2007/0262714 A1 | 11/2007 | Bylsma |
| 2007/0263408 A1 | 11/2007 | Chua et al. |
| 2007/0281140 A1 | 12/2007 | Haubrich et al. |
| 2007/0298160 A1 | 12/2007 | Jang et al. |
| 2008/0001124 A1 | 1/2008 | Hachiya et al. |
| 2008/0001167 A1 | 1/2008 | Coe-Sullivan et al. |
| 2008/0001528 A1 | 1/2008 | Eida |
| 2008/0007156 A1 | 1/2008 | Gibson et al. |
| 2008/0012031 A1 | 1/2008 | Jang et al. |
| 2008/0029710 A1 | 2/2008 | Sekiya et al. |
| 2008/0037282 A1 | 2/2008 | Kurihara |
| 2008/0048936 A1 | 2/2008 | Powell et al. |
| 2008/0172197 A1 | 2/2008 | Skipor et al. |
| 2008/0057342 A1 | 3/2008 | Sekiya |
| 2008/0062717 A1 | 3/2008 | Lee |
| 2008/0074050 A1 | 3/2008 | Chen et al. |
| 2008/0084706 A1 | 4/2008 | Roshan et al. |
| 2008/0085088 A1 | 4/2008 | Lin et al. |
| 2008/0094829 A1 | 4/2008 | Narendran et al. |
| 2008/0106887 A1 | 5/2008 | Salsbury et al. |
| 2008/0117500 A1 | 5/2008 | Narendran et al. |
| 2008/0121911 A1 | 5/2008 | Andrews et al. |
| 2008/0135914 A1 | 6/2008 | Krishna et al. |
| 2008/0144333 A1 | 6/2008 | Gourlay |
| 2008/0149958 A1 | 6/2008 | Reeh et al. |
| 2008/0165235 A1 | 7/2008 | Rolly et al. |
| 2008/0169753 A1 | 7/2008 | Skipor et al. |
| 2008/0173886 A1 | 7/2008 | Cheon et al. |
| 2008/0218068 A1 | 9/2008 | Cok |
| 2008/0230120 A1 | 9/2008 | Reddy |
| 2008/0231170 A1 | 9/2008 | Masato et al. |
| 2008/0237540 A1 | 10/2008 | Dubrow |
| 2008/0237611 A1 | 10/2008 | Cok et al. |
| 2008/0246017 A1 | 10/2008 | Gillies et al. |
| 2008/0252198 A1 | 10/2008 | Katano et al. |
| 2008/0254210 A1 | 10/2008 | Lai et al. |
| 2008/0276817 A1 | 11/2008 | Hinch et al. |
| 2008/0277626 A1 | 11/2008 | Yang et al. |
| 2008/0278063 A1 | 11/2008 | Cok |
| 2008/0280161 A1 | 11/2008 | Jang et al. |
| 2008/0308825 A1 | 12/2008 | Chakraborty et al. |
| 2009/0001385 A1 | 1/2009 | Skipor et al. |
| 2009/0017268 A1 | 1/2009 | Skipor et al. |
| 2009/0021148 A1 | 1/2009 | Hachiya et al. |
| 2009/0034292 A1 | 2/2009 | Pokrovskiy et al. |
| 2009/0050907 A1 | 2/2009 | Yuan et al. |
| 2009/0059554 A1 | 3/2009 | Skipor et al. |
| 2009/0057662 A1 | 4/2009 | Cho et al. |
| 2009/0091239 A1 | 4/2009 | Cho et al. |
| 2009/0114932 A1 | 5/2009 | Chou |
| 2009/0140275 A1 | 6/2009 | Santori et al. |
| 2009/0152567 A1 | 6/2009 | Comerford et al. |
| 2009/0162011 A1 | 6/2009 | Coe-Sullivan et al. |
| 2009/0168415 A1 | 7/2009 | Deurenberg et al. |
| 2009/0173957 A1 | 7/2009 | Brunner et al. |
| 2009/0174022 A1 | 7/2009 | Coe-Sullivan et al. |
| 2009/0181478 A1 | 7/2009 | Cox et al. |
| 2009/0196160 A1 | 8/2009 | Crombach et al. |
| 2009/0201577 A1* | 8/2009 | LaPlante ............ G01N 21/6458 359/355 |
| 2009/0208753 A1 | 8/2009 | Coe-Sullivan et al. |
| 2009/0212695 A1 | 8/2009 | Kim et al. |
| 2009/0215208 A1 | 8/2009 | Coe-Sullivan et al. |
| 2009/0215209 A1 | 8/2009 | Anc et al. |
| 2009/0236621 A1 | 9/2009 | Chakaborty |
| 2009/0236622 A1 | 9/2009 | Nishihara |
| 2009/0242871 A1 | 10/2009 | Kobayashi et al. |
| 2009/0251759 A1 | 10/2009 | Domash et al. |
| 2009/0263656 A1 | 10/2009 | Chae et al. |
| 2009/0272996 A1 | 11/2009 | Chakraborty |
| 2009/0274188 A1 | 11/2009 | Jang et al. |
| 2009/0278131 A1 | 11/2009 | Kwon et al. |
| 2009/0278141 A1 | 11/2009 | Coe-Sullivan et al. |
| 2009/0280586 A1 | 11/2009 | Coe-Sullivan et al. |
| 2009/0283742 A1 | 11/2009 | Coe-Sullivan et al. |
| 2009/0286338 A1 | 11/2009 | Coe-Sullivan et al. |
| 2009/0321755 A1 | 12/2009 | Jang et al. |
| 2010/0001256 A1 | 1/2010 | Coe-Sullivan et al. |
| 2010/0002414 A1 | 1/2010 | Meir |
| 2010/0014799 A1 | 1/2010 | Bulovic et al. |
| 2010/0044636 A1 | 2/2010 | Ramprasad et al. |
| 2010/0044729 A1 | 2/2010 | Naum et al. |
| 2010/0051870 A1 | 3/2010 | Ramprasad |
| 2010/0051898 A1 | 3/2010 | Kim et al. |
| 2010/0051901 A1 | 3/2010 | Kazias et al. |
| 2010/0052512 A1 | 3/2010 | Clough et al. |
| 2010/0067214 A1 | 3/2010 | Hoelen et al. |
| 2010/0068468 A1 | 3/2010 | Coe-Sullivan et al. |
| 2010/0079061 A1 | 4/2010 | Tsai et al. |
| 2010/0090597 A1 | 4/2010 | Werners et al. |
| 2010/0103648 A1 | 4/2010 | Kim et al. |
| 2010/0110728 A1 | 5/2010 | Dubrow et al. |
| 2010/0113813 A1 | 5/2010 | Pickett et al. |
| 2010/0123155 A1 | 5/2010 | Pickett et al. |
| 2010/0142183 A1 | 6/2010 | Lerenius |
| 2010/0144231 A1 | 6/2010 | Landry et al. |
| 2010/0149814 A1 | 6/2010 | Zhai et al. |
| 2010/0155749 A1 | 6/2010 | Chen et al. |
| 2010/0155786 A1 | 7/2010 | Heald et al. |
| 2010/0167011 A1 | 7/2010 | Dubrow |
| 2010/0193767 A1 | 8/2010 | Naasani et al. |
| 2010/0193806 A1 | 8/2010 | Byun |
| 2010/0208493 A1 | 8/2010 | Choi et al. |
| 2010/0246009 A1 | 9/2010 | Polley et al. |
| 2010/0265307 A1 | 10/2010 | Linton et al. |
| 2010/0265734 A1 | 10/2010 | Bulovic et al. |
| 2010/0283014 A1 | 11/2010 | Breen et al. |
| 2010/0283036 A1 | 11/2010 | Coe-Sullivan et al. |
| 2010/0283072 A1 | 11/2010 | Kazlas et al. |
| 2010/0289044 A1 | 11/2010 | Krames et al. |
| 2010/0314646 A1 | 12/2010 | Breen et al. |
| 2011/0068321 A1 | 3/2011 | Pickett et al. |
| 2011/0068322 A1 | 3/2011 | Pickett et al. |
| 2011/0081538 A1 | 4/2011 | Linton et al. |
| 2011/0103064 A1 | 5/2011 | Coe-Sullivan et al. |
| 2011/0127552 A1 | 6/2011 | Van Herpen et al. |
| 2011/0141769 A1 | 6/2011 | Lee et al. |
| 2011/0175054 A1 | 7/2011 | Ren et al. |
| 2011/0182056 A1 | 7/2011 | Trottier et al. |
| 2011/0186811 A1 | 8/2011 | Coe-Sullivan et al. |
| 2011/0199555 A1 | 8/2011 | Coe-Sullivan et al. |
| 2011/0233483 A1 | 9/2011 | Breen et al. |
| 2011/0241229 A1 | 10/2011 | Naasani et al. |
| 2011/0303940 A1 | 12/2011 | Lee et al. |
| 2011/0309325 A1 | 12/2011 | Park et al. |
| 2012/0075837 A1 | 3/2012 | Um |
| 2012/0113671 A1 | 5/2012 | Sadasivan et al. |
| 2012/0113672 A1 | 5/2012 | Dubrow et al. |
| 2012/0155115 A1 | 6/2012 | Jang et al. |
| 2012/0187367 A1 | 7/2012 | Modi et al. |
| 2012/0189791 A1 | 7/2012 | Modi et al. |
| 2012/0256134 A1 | 10/2012 | Nick |
| 2012/0256141 A1 | 10/2012 | Nick et al. |
| 2012/0286238 A1 | 11/2012 | Linton et al. |
| 2012/0313075 A1 | 12/2012 | Linton et al. |
| 2013/0032768 A1 | 2/2013 | Arbell et al. |
| 2013/0099212 A1 | 4/2013 | Jang et al. |
| 2013/0114301 A1 | 5/2013 | Um |
| 2013/0215136 A1 | 8/2013 | Jiao et al. |
| 2013/0221291 A1 | 8/2013 | Breen et al. |

FOREIGN PATENT DOCUMENTS

| | | |
|---|---|---|
| JP | 2002091352 | 3/2002 |
| JP | 2002525394 A | 8/2002 |
| JP | 2004-071357 | 3/2004 |
| JP | 2005038768 | 2/2005 |
| JP | 2005073202 | 3/2006 |
| JP | 2006059723 | 3/2006 |
| JP | 2006073869 | 3/2006 |
| JP | 2006190679 | 7/2006 |

(56) References Cited

FOREIGN PATENT DOCUMENTS

| | | |
|---|---|---|
| JP | 2006278082 | 10/2006 |
| JP | 2007073206 | 3/2007 |
| JP | 2007103099 | 4/2007 |
| JP | 2007103513 | 4/2007 |
| JP | 200713390 A | 5/2007 |
| KR | 100724035 B1 | 5/2007 |
| KR | 1020100015662 A | 2/2010 |
| KR | 20110012246 | 2/2011 |
| KR | 20110044002 | 4/2011 |
| KR | 20110065053 | 6/2011 |
| KR | 20110068109 | 6/2011 |
| WO | 0017655 A1 | 3/2000 |
| WO | 2006118954 A2 | 11/2006 |
| WO | WO2007024331 A1 | 3/2007 |
| WO | WO-2007046649 | 4/2007 |
| WO | 2007117668 A2 | 10/2007 |
| WO | 2007117672 A2 | 10/2007 |
| WO | 2007117698 A2 | 10/2007 |
| WO | 2007120877 A2 | 10/2007 |
| WO | WO-2008029633 A1 | 3/2008 |
| WO | 2009035657 A1 | 3/2009 |
| WO | WO-2009137053 | 11/2009 |
| WO | WO-2009151515 | 12/2009 |
| WO | WO-2011020098 | 2/2011 |
| WO | WO-2012012675 A1 | 1/2012 |
| WO | WO 2012135744 | 10/2012 |
| WS | WO 2012021643 | 2/2012 |

OTHER PUBLICATIONS

Office Action dated May 8, 2017 of the corresponding U.S. Appl. No. 14/853,263.
European Official Communication dated Mar. 18, 2015 for European Patent Application No. 09 762 812.7, which is the European Counterpart of the present application.
Final Office Action dated Nov. 3, 2014 for copending U.S. Appl. No. 12/657,282, filed Jan. 15, 2010.
EP Official Communication dated May 13, 2014 in EP 09762812.7 which is the EPO counterpart of present U.S. Appl. No. 12/940,355.
JP Reexamination Report dated Apr. 23, 2014 in Japanese Patent Application No. JP-2010514795 which is the Japanese counterpart of U.S. Pat. No. 8,718,437.
English translation of JP Notice of Rejection dated Nov. 4, 2014 in Japanese Patent Application No. JP-2013-252719 which is a divisional of Japanese Patent Appliation No. JP-2010514795, which is the Japanese counterpart of U.S. Pat. No. 8,718,437.
KR Notice of Preliminary Rejection dated Sep. 5, 2014 in Korean Patent Application No. 10-2010-7001542 which is the Japanese counterpart of U.S. Pat. No. 8,718,437.
Yeh, D.M., et al., "Making white-light-emitting diodes without phosphors", *SPIE* Illumination & Displays (2008), SPIEDigitalLibrary. org.
Yu, H., et al., "Quantum dot and silica nanoparticle doped polymer optical fibers", *Optics Express* (2007), vol. 15, No. 16.
Ashdown, I., et al., "Six-color mixing and warm-white/green/blue offer new approaches to generating white LED light" *LEDs Magazine*, Oct. 2006, pp. 19-21.
English translation of Japanese Office Action dated Dec. 10, 2013 in JP Patent Application No. 2011-508496, which is the Japanese counterpart of this U.S. Appl. No. 12/940,355.
English translation of Japanese Office Action dated May 14, 2013 in JP Patent Application No. 2011-508496, which is the Japanese counterpart of this U.S. Appl. No. 12/940,355.
Notice of Allowance dated Dec. 11, 2013 in copending U.S. Appl. No. 12/283,609, flied Sep. 12, 2008.
Office Action dated Aug. 13, 2013 in copending U.S. Appl. No. 12/940,343, filed Nov. 5, 2010.
Original language Japanese Office Action dated Dec. 10, 2013 in JP Patent Application No. 2011-508496, which is the Japanese counterpart of this U.S. Appl. No. 12/940,355.
Original language Japanese Office Action dated May 14, 2013 in JP Patent Application No. 2011-508496, which is the Japanese counterpart of this U.S. Appl. No. 12/940,355.
PCT Search Report and Written Opinion for related International Application No. PCT/US2009/002789 dated Nov. 13, 2009. (PCT/US2009/002789 is the parent of the present application.).
PCT Search Report and Written Opinion for related International Application No. PCT/US2010/045624 dated Oct. 6, 2010. (PCT/US2010/045624 is the parent of copending U.S. Appl. No. 13/372,262.).
PCT/US2009/002796 Search Report and Written Opinion, QD Vision, Inc., dated Jun. 23, 2009 (PCT/US2009/002796 is the parent of copending U.S. Appl. No. 12/940,343).
Dabbousi, et al., "(CdSe) ZnS Core-Shell Quantum Dots: Synthesis and Characterizaqtion of a Size Series of Highly Luminescent Nanocrystallites", *J. Phys. Chem.* 101, 9463, 1997.
De Mello et al., "An Improved Experimental Determination of External Photoluminescence Quantum Efficiency", *Adv. Mater*, 9(3):230 (1997).
EP Official Communication dated Aug. 20, 2012 in EP 09762812.7 filed from International Application No. PCT/US2009/002789.
EP Supplementary European Search Report dated Oct. 31, 2011 in EP 09762812.7 filed from International Application No. PCT/US2009/002789.
Goetz, W., et al., "Development of Key Technologies for White Lighting Based on Light-Emitting diodes (LEDs)", Final Report dated Jun. 2004, DOE Award No. DE-FC26-01NT41251.
Gosnell, et al., "Cadmium Selenide Nanocrystals as White-Light Phosphors", *Proc. of SPIE*, vol. 6337, 63370A, (2006).
Jones-Bey, H., "Quantum-dot research targets general illumination", *Laser Focus World* (www.laserfocusworld.com), Mar. 2006.
Korten, et al., "Nucleation and Growth of CdSe on ZnS Quantum Crystallite Seeds, and Vice Versa, in Inverse Micelle Media", *J. Am. Chem. Soc.*, vol. 112, 1327 (1990).
Kumar, A., et al., "Features of gold having micrometer to centimeter dimensions can be formed through a combination of stamping with en elastomeric stamp and an alkanethiol 'Ink' followed by chemical etching", *Appl. Phys. Lett.*, 63, pp. 2002-2004, (1993).
Lee, J., et al., "Full Color Emission from II-VI Semiconductor Quantum Dot-Polymer Composites" *Adv. Mater*. 2000, 12, No. 15, Aug. 2.
Mannan, O., "Creating White Light Utilizing Remote Phosphor Technology", Future Electronics, FTM, Oct. 2011, p. 26-27.
Masul, H., et al., "Effects of Phosphor Application Geometry on White Light-Emitting Diodes", *Jpn. Soc. Appl. Phys.*, vol. 45, No. 34, 2006, pp. L910-L912.
Mueller-Mach, R., et al., "High-Power Phosphor-Converted Light-Emitting Diodes Based on III-Nitrides", *IEEE Journal On Selected Topics In Quantum Electronics*, vol. 8, No. 2, 339-345 (Mar./Apr. 2002).
Murray, Christopher, Thesis entitled "Synthesis and Characterization of II-VI Quantum Dots and Their Assembly Into 3-D Quantum Dot Superlattices", Massachusetts Institute of Technology, Sep. 1995.
Murray, et al., "Synthesis and Characterization of Nearly Monodisperse CdE (E=S, Se, Te) Semiconductor Nanocrystallites". (Nov. 1993), *J. Am. Chem, Soc.*, 115, pp. 8706-8715.
Narendran, N., et al., "Extracting phosphor-scattered photons to improve white LED efficiency", *Phys. Stat. Sol.* (a) 202, No. 6, R60-R62 (2005) (www.oss-rapid.com).
Ohno, Y., "Color Issues of White LEDs", Preprint; A section in "Solid State Light Emitting Diodes for General Illumination", OIDA Workshop Preliminary Report, Oct. 26-27, 2000, also In "OLEDS for General Illumination", OIDA Workshop Preliminary Report, Nov. 30-Dec. 1, 2000.
Santhanam, V. et al., "Mlcrocontact Printing of Uniform Nanoparticle Arrays", *Nano Letters*, 4, (2004), pp. 41-44.
Schlotter, P., et al., "Luminescence conversion of blue light emitting diodes", *Appl. Phys. A* 64, 417-418 (1997).
Song, H.; et al., "Photoluminescent (CdSe)ZnS quantum dot-polymethylmethacrylate polymer composite thin films in the visible range", *Nanotechnology* 18 (2007) 055401 (6 pp).

(56) References Cited

OTHER PUBLICATIONS

Steigerwald, D., et al., "Illumination With Solid State Lighting Technology", *IEEE Journal on Selected Topics in Quantum Electronics*, vol. 8, No. 2, 310-320 (Mar./Apr. 2002).
U.S. Department of Energy, "Understanding Photometric Reports for SSL Products", PNNL-SA-67277 Jun. 2009.
Ziegler, J., et al., "Silica-coated InP/ZnS Nanocrystals as Converter Material in White LEDs", *Adv, Mater.* 2008, 20, 4068-4073.
Ziegler, Jan, "Ph/D/ thesis Preparation and application of nanocrystals for white LEDs", Oct. 1, 2007, School of Chemical Sciences and Pharmacy, University of East Anglia, Norwich UK, Norwich, UK.
Firth et al., "Optical Properties of CdSe nanocrystals in a polymer matrix", Applied Physics Letters, vol. 75, No. 20, 3120 (1999).
Fuchs, D.T., et al., "Making waveguides containing nanocrystalline quantum dots", Proc. Of SPIE, vol. 5592, (SPIE Bellingham, WA 2005).

\* cited by examiner

SOLID STATE LIGHTING DEVICES INCLUDING QUANTUM CONFINED SEMICONDUCTOR NANOPARTICLES, AN OPTICAL COMPONENT FOR A SOLID STATE LIGHTING DEVICE, AND METHODS

This application is a continuation of U.S. patent application Ser. No. 12/940,355 filed 5 Nov. 2010, now U.S. Pat. No. 9,167,659, which is a continuation of commonly owned International Application No. PCT/US2009/002789 filed 6 May 2009, which was published in the English language as PCT Publication No. WO2009/151515 on 17 Dec. 2009, which International Application claims priority to U.S. Application No. 61/050,929, filed 6 May 2008, U.S. Application No. 61/162,293, filed 21 Mar. 2009, U.S. Application No. 61/173,375 filed 28 Apr. 2009, and U.S. Application No. 61/175,430 filed 4 May 2009, each of the foregoing hereby being incorporated herein by reference in its entirety.

TECHNICAL FIELD OF THE INVENTION

The present invention relates to the technical field of solid state lighting devices including nanoparticles, lighting fixtures and components including nanoparticles, and methods.

SUMMARY OF THE INVENTION

The present invention relates to a solid state lighting device including a light source and an optical component that is positioned to receive at least a portion of light emitted from the light source, such that the optical component converts a portion of the light received by the optical component to one or more predetermined wavelengths to alter at least one characteristic of light output emitted from the device. The present invention also relates to lighting fixtures and components including an optical material to convert at least a portion of light emitted from a light source. The present invention also relates to methods for improving the lumens per watt efficiency of a solid state lighting device.

In accordance with one aspect of the present invention, there is provided a solid state lighting device comprising a light source capable of emitting white light including a blue spectral component and having a deficiency in a spectral region, and an optical component that is positioned to receive at least a portion of the light generated by the light source, the optical component comprising an optical material for converting at least a portion of the blue spectral component of the light to one or more predetermined wavelengths such that light emitted by the solid state lighting device includes light emission from the light source supplemented with light emission at one or more predetermined wavelengths, wherein the optical material comprises quantum confined semiconductor nanoparticles.

In certain preferred embodiments, the predetermined wavelength is selected to meet or compensate for the deficiency in the spectral region of the light source. In certain embodiments, for example, where the light source emits white light with a spectral deficiency in the red spectral region, the predetermined wavelength can be in a range from about 575 nm to about 650 nm, from about 580 nm to about 630 nm, from about 590 nm to about 630 nm, from about 590 nm to about 630 nm, or from about 600 nm to about 620 nm. In certain embodiments, the wavelength is about 616 nm.

In certain embodiments, for example, where the light source has a spectral deficiency in the cyan spectral region, the predetermined wavelength can be in a range from about 450 nm to about 500 nm.

In certain embodiments, for example, where the light source emits white light with one or more spectral deficiencies, the optical component can comprise an optical material including one or more different types of quantum confined semiconductor nanoparticles (based on composition, structure and/or size), wherein each different type of quantum confined semiconductor nanoparticle can convert a portion of the blue spectral component of the light to a predetermined wavelength that is different from the predetermined wavelength emitted by at least one of any other type of quantum confined semiconductor nanoparticles included in the optical material.

In embodiments including two or more different types of quantum confined semiconductor nanoparticles that emit at different predetermined wavelengths, the different types of quantum confined semiconductor nanoparticles can be included in one or more different optical materials. In certain embodiments, different types of quantum confined semiconductor nanocrystals can be included in separate optical materials.

In certain embodiments including two or more different optical materials, such different optical materials can, for example, be included as separate layers of a layered arrangement and/or as separate features of a patterned layer.

In certain embodiments including two or more different types of quantum confined semiconductor nanoparticles that emit at different predetermined wavelengths, the different types of quantum confined semiconductor nanoparticles can be included in two or more different optical components in a stacked arrangement. In such embodiments, each optical component can include one or more optical materials as described above.

In embodiments including two or more different types of quantum confined semiconductor nanoparticles that emit at different predetermined wavelengths, light emitted by the solid state lighting device includes light emission that is supplemented with light emission at such two or more different predetermined wavelengths. In such case, the two or more different predetermined wavelengths are selected to meet or compensate for one or more of the spectral deficiencies of the light source.

In certain embodiments, compensation of one or more spectral deficiencies of the light source by the optical component can also increase the General Color Rendering Index ($R_a$) of light output from the light source. For example, in certain embodiments, the optical component can increase the General Color Rendering Index ($R_a$) of light output from the light source by at least 10%. In certain embodiments, the General Color Rendering Index ($R_a$) is increased to a predetermined General Color Rendering Index ($R_a$).

In certain embodiments, compensation of one or more spectral deficiencies of the light source by the optical component can alter the correlated color temperature (CCT) of light output from the light source. In certain embodiments, the optical component can lower the correlated color temperature of light output from the light source by, for example, at least about 1000K; at least about 2000K, at least 3000K, at least 4000K, etc.

In certain preferred embodiments, the lumens per watt efficiency of the light source is not substantially affected by alteration of the CCT through use of the optical component.

In certain embodiments, the CCT is altered to a predetermined CCT.

In certain preferred embodiments, quantum confined semiconductor nanoparticles comprise semiconductor nanocrystals.

In certain embodiments, the quantum confined semiconductor nanoparticles have a solid state quantum efficiency of at least 40%. In certain embodiments, the quantum confined semiconductor nanoparticles have a solid state quantum efficiency of at least 50%. In certain embodiments, the quantum confined semiconductor nanoparticles have a solid state quantum efficiency of at least 60%.

In certain embodiments, the quantum confined semiconductor nanoparticles maintain at least 40% efficiency during operation of the solid state light emitting device.

In certain preferred embodiments, the optical material comprises quantum confined semiconductor nanoparticles capable of emitting red light.

In certain embodiments, for example, the light emitted by the light source has a General Color Rendering Index ($R_a$) less than 80. In certain embodiments, the light emitted by the solid state lighting device has a General Color Rendering Index ($R_a$) greater than 80. In certain embodiments, the light emitted by the solid state lighting device has a General Color Rendering Index ($R_a$) greater than 85. In certain embodiments, the light emitted by the solid state lighting device has a General Color Rendering Index ($R_a$) greater than 90. In certain embodiments, the light emitted by the solid state lighting device has a General Color Rendering Index ($R_a$) greater than 95. In certain embodiments, the General Color Rendering Index ($R_a$) of the light emitted by the solid state lighting device is at least 10% higher than the General Color Rendering Index ($R_a$) of the light emitted by the light source.

In certain embodiments, light emitted from the solid state lighting device has a correlated color temperature that is at least about 1000K less than that of light emitted from the light source.

In certain embodiments, light emitted from the solid state lighting device has a correlated color temperature that is at least about 2000K less than that of light emitted from the light source.

In certain embodiments, light emitted from the solid state lighting device has a correlated color temperature that is at least about 3000K less than that of light emitted from the light source.

In certain embodiments, light emitted from the solid state lighting device has a correlated color temperature that is at least about 4000K less than that of light emitted from the light source.

In certain embodiments, the solid state lighting device maintains greater than 70% of the light source lumens per watt efficiency. In certain embodiments, the solid state lighting device maintains greater than 80% of the light source lumens per watt efficiency. In certain embodiments, the solid state lighting device maintains greater than 90% of the light source lumens per watt efficiency. In certain embodiments, the solid state lighting device maintains greater than 100% of the light source lumens per watt efficiency. In certain embodiments, the solid state lighting device maintains greater than 110% of the light source lumens per watt efficiency.

In certain embodiments, the lumens per watt efficiency of the solid state lighting device does not substantially vary as a function of the color temperature of the solid state lighting device.

In certain embodiments, the optical material further comprises a host material in which the quantum confined semiconductor nanoparticles are distributed. In certain embodiments, quantum confined semiconductor nanoparticles are included in the optical material in an amount in a range from about 0.001 to about 5 weight percent of the weight of the host material. In certain embodiments, quantum confined semiconductor nanoparticles are included in the optical material in an amount in a range from about 0.5 to about 3 weight percent of the weight of the host material. In certain embodiments, quantum confined semiconductor nanoparticles are included in the optical material in an amount in a range from about 1 to about 3 weight percent of the weight of the host material. In certain embodiments, quantum confined semiconductor nanoparticles are included in the optical material in an amount in a range from about 1 to about 2 weight percent of the weight of the host material.

In certain embodiments, the optical material further comprises light scatterers. In certain embodiments, the light scatterers comprise light scattering particles. In certain embodiments, light scattering particles are included in the optical material in an amount in a range from about 0.001 to about 5 weight percent of the weight of the host material. In certain embodiments, light scattering particles are included in the optical material in an amount in a range from about 0.5 to about 3 weight percent of the weight of the host material. In certain embodiments, light scattering particles are included in the optical material in an amount in a range from about 1 to about 3 weight percent of the weight of the host material. In certain embodiments, light scattering particles are included in the optical material in an amount in a range from about 1 to about 2 weight percent of the weight of the host material.

In certain embodiments, an optical component further includes a support element. Preferably, the support element is optically transparent to light emitted from the light source and to light emitted from the nanoparticles.

In certain embodiments, the support element can include other optional layers.

In certain embodiments, the support element can include other optional features.

In certain embodiments, the optical material is at least partially encapsulated.

In certain embodiments, the optical material is fully encapsulated.

In certain embodiments, an optical component including a support element can serve as a cover plate for the solid state lighting device.

In certain embodiments, the support element comprises a light diffuser component of the solid state lighting device.

In certain embodiments, the support element is rigid.

In certain embodiments, the support element is flexible.

In certain embodiments, the optical material comprising quantum confined semiconductor nanoparticles is disposed over a surface of a support element. Preferably, the optical material is disposed over a major surface of the support element. Preferably, the optical material is disposed over a surface of the support element facing the light source.

In certain embodiments, the optical material is disposed as one or more layers over a predetermined area of a surface of the support element.

In certain embodiments, the layer comprises an optical material that further includes a host material in which the quantum confined semiconductor nanoparticles are distributed. In certain embodiments, the layer includes from about 0.001 to about 5 weight percent quantum confined semiconductor nanoparticles based on the weight of the host material. In certain embodiments, the layer further comprises light scatterers. In certain embodiments, light scatterers are included in the layer in an amount in the range from about 0.001 to about 5 weight percent of the weight of the host material.

In certain embodiments, a layer including optical material including a host material has a thickness, for example, from about 0.1 micron to about 1 cm. In certain embodiments, a layer including optical material including a host material has a thickness from about 0.1 to about 200 microns. In certain embodiments, a layer including optical material including a host material has a thickness from about 10 to about 200 microns. In certain embodiments, a layer including optical material including a host material has a thickness from about 30 to about 80 microns.

In certain preferred embodiments, the optical material is not in direct contact with the light source.

In certain preferred embodiments, the optical component is not in direct contact with the light source.

In certain preferred embodiments, the temperature at the location of the nanoparticles in the solid state light emitting device during operation is 90° C. or less.

In certain preferred embodiments, the temperature at the location of the nanoparticles in the solid state light emitting device during operation is 75° C. or less.

In certain preferred embodiments, the temperature at the location of the nanoparticles in the solid state light emitting device during operation is 60° C. or less.

In certain preferred embodiments, the temperature at the location of the nanoparticles in the solid state light emitting device during operation is 50° C. or less.

In certain preferred embodiments, the temperature at the location of the nanoparticles in the solid state light emitting device during operation is 40° C. or less.

In certain more preferred embodiments, the temperature at the location of the nanoparticles in the solid state light emitting device during operation is in a range from about 30° C. to about 60° C.

In certain embodiments, the light source comprises a white light emitting device. (A light emitting device is also referred to herein as an "LED").

In certain preferred embodiments, the white light emitting LED comprises a blue light emitting semiconductor LED including a phosphor material for converting the blue LED light output to white light. In certain embodiments, optical material can comprise quantum confined semiconductor nanoparticles capable of emitting light in the orange to red spectral (e.g., from about 575 nm to about 650 nm) region. In certain embodiments, optical material can comprise quantum confined semiconductor nanoparticles capable of emitting light in the red spectral region. In certain embodiments, optical material can comprise quantum confined semiconductor nanoparticles capable of emitting light in the orange spectral region. In certain embodiments, optical material can comprise quantum confined semiconductor nanoparticles capable of emitting light in the cyan spectral region. In certain embodiments, optical material can comprise quantum confined semiconductor nanoparticles capable of emitting light in one or more other spectral regions in which the light source has a deficiency.

In certain embodiments, the white light emitting LED comprises a UV light emitting semiconductor LED including a phosphor material for converting the UV LED light output to white light. In certain embodiments, optical material can comprise quantum confined semiconductor nanoparticles capable of emitting light in the orange to red spectral (e.g., from about 575 nm to about 650 nm) region. In certain embodiments, optical material can comprise quantum confined semiconductor nanoparticles capable of emitting light in the red spectral region. In certain embodiments, optical material can comprise quantum confined semiconductor nanoparticles capable of emitting light in the cyan spectral region. In certain embodiments, optical material can comprise quantum confined semiconductor nanoparticles capable of emitting light in the orange spectral region. In certain embodiments, optical material can comprise quantum confined semiconductor nanoparticles capable of emitting light in one or more other spectral regions in which the light source has a deficiency.

In certain embodiments, a solid state lighting device comprises a light source comprising an LED capable of emitting white light including emission in the blue spectral region and having a deficiency in the red spectral region; and an optical component that is positioned to receive light emitted by the LED, the optical component comprising an optical material for converting at least a portion of the emission in the blue spectral region to light in the red spectral region with a wavelength in a range from about 600 nm to about 620 nm such that light emitted by the solid state lighting device includes white light emission from the LED light source supplemented with light emission in the red spectral region, wherein the optical material comprises quantum confined semiconductor nanoparticles.

In certain embodiments, a solid state lighting device comprises a light source comprising an LED capable of emitting white light including emission in the blue spectral region and having a deficiency in the orange to red spectral region; and an optical component that is positioned to receive light emitted by the LED, the optical component comprising an optical material for converting at least a portion of the emission in the blue spectral region to light in the spectral region from about 575 nm to about 650 nm such that light emitted by the solid state lighting device includes white light emission from the LED light source supplemented with light emission in the spectral region from about 575 nm to about 650 nm, wherein the optical material comprises quantum confined semiconductor nanoparticles. In certain embodiments, for example, the optical material can convert at least a portion of the blue spectral emission to light in the spectral region from about 575 nm to about 650 nm, from about 580 to about 630 nm, from about 590 nm to about 630 nm, from about 600 nm to about 620 nm, etc. In certain embodiments, the wavelength can be about 616 nm.

In certain embodiments, at least 10% of the emission in the blue spectral region is converted by the quantum confined semiconductor nanoparticles.

In certain embodiments, at least 30% of the emission in the blue spectral region is converted by the quantum confined semiconductor nanoparticles.

In certain embodiments, at least 60% of the emission in the blue spectral region is converted by the quantum confined semiconductor nanoparticles.

In certain embodiments, at least 90% of the emission in the blue spectral region is converted by the quantum confined semiconductor nanoparticles.

In certain embodiments, from about 50% to about 75% of the emission in the blue spectral region is converted by the quantum confined semiconductor nanoparticles.

In certain embodiments, quantum confined semiconductor nanoparticles included in an optical material are cadmium free.

In certain embodiments, quantum confined semiconductor nanoparticles included in an optical material comprise a III-V semiconductor material.

In certain embodiments, quantum confined semiconductor nanoparticles included in an optical material comprise a semiconductor nanocrystal including a core comprising a semiconductor material and an inorganic shell disposed on at least a portion of a surface of the core.

In accordance with another aspect of the present invention, there is provided an endoscopy light source comprising a solid state lighting device taught herein.

In accordance with another aspect of the present invention, there is provided an endoscopy light source comprising an optical component taught herein.

In accordance with another aspect of the present invention, there is provided an optical component useful with a light source that emits white light including a blue spectral component and at least one spectral deficiency in another region of the spectrum, the optical component comprising an optical material for converting at least a portion of the blue spectral component of light output from the light source to one or more different predetermined wavelengths, wherein the optical material comprises quantum confined semiconductor nanoparticles.

In certain preferred embodiments, the predetermined wavelength is selected to meet or compensate for at least one of the spectral deficiencies of the light source, for example, by supplementing the light output of the light source in at least one of the spectral deficiency regions.

In certain embodiments, for example, where the light source emits white light with a spectral deficiency in the red spectral region, the predetermined wavelength can be in a range from about 575 nm to about 650 nm, from about 580 nm to about 630 nm, from about 590 nm to about 630 nm, from about 600 nm to 620 nm, etc. In certain preferred embodiments, the wavelength is about 616 nm.

In certain more preferred embodiments, the optical material includes one or more different types of quantum confined semiconductor nanoparticles wherein the different types can emit at one or more different predetermined wavelengths to compensate for one or more spectral deficiencies of the light output from the light source.

In certain embodiments, for example, where the light source emits white light with a spectral deficiency in the cyan spectral region, the predetermined wavelength can be in a range from about 450 nm to about 500 nm.

In certain embodiments, the optical component includes an optical material comprising one or more different types of quantum confined semiconductor nanoparticles (based on composition, structure and/or size), wherein each different type of quantum confined semiconductor nanoparticles emits light at predetermined wavelength that can be the same or different from the predetermined wavelength emitted any other type of quantum confined semiconductor nanoparticles included in the optical material, and wherein one or more different predetermined wavelengths are selected such that the optical material will compensate for one or more spectral deficiencies of the intended light source. In certain embodiments including two or more different types of quantum confined semiconductor nanoparticles, at least two of the types are capable of emitting light at a predetermined wavelength that is different from that emitted by other types of quantum confined semiconductor nanoparticles that may be included in the optical component.

In certain embodiments including two or more different types of quantum confined semiconductor nanoparticles that emit at different predetermined wavelengths, the different types of quantum confined semiconductor nanoparticles can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments including two or more different optical materials, such different optical materials can, for example, be included as separate layers of a layered arrangement and/or as separate features of a patterned layer.

In certain embodiments, compensation of one or more spectral deficiencies of the light source by the optical component can also increase the General Color Rendering Index ($R_a$) of light output from the light source. For example, in certain embodiments, the optical component can increase the General Color Rendering Index ($R_a$) of light output from the light source by at least 10%. In certain embodiments, the General Color Rendering Index ($R_a$) is increased to a predetermined General Color Rendering Index ($R_a$).

In certain embodiments, compensation of one or more spectral deficiencies of the light source by the optical component can alter the correlated color temperature (CCT) of light output from the light source. In certain embodiments, the optical component can lower the correlated color temperature of light output from the light source by, for example, at least about 1000K; at least about 2000K, at least 3000K, at least 4000K, etc.

In certain embodiments, the lumens per watt efficiency of the light source is not substantially affected by alteration of the CCT through use of the optical component.

In certain embodiments, the CCT is altered to a predetermined CCT.

In certain preferred embodiments, quantum confined semiconductor nanoparticles comprise semiconductor nanocrystals.

In certain embodiments, the quantum confined semiconductor nanoparticles have a solid state quantum efficiency of at least 40%. In certain embodiments, the quantum confined semiconductor nanoparticles have a solid state quantum efficiency of at least 50%. In certain embodiments, the quantum confined semiconductor nanoparticles have a solid state quantum efficiency of at least 60%.

In certain embodiments, the quantum confined semiconductor nanoparticles maintain at least 40% efficiency during use of the optical component.

In certain preferred embodiments, the optical material comprises quantum confined semiconductor nanoparticles capable of emitting red light. In other certain preferred embodiments, the optical material comprises quantum confined semiconductor nanoparticles capable of emitting light in the orange to red spectral region.

In certain embodiments, the optical material further comprises a host material in which the quantum confined semiconductor nanoparticles are distributed. In certain embodiments, quantum confined semiconductor nanoparticles are included in the optical material in an amount in a range from about 0.001 to about 5 weight percent of the weight of the host material. In certain embodiments, quantum confined semiconductor nanoparticles are included in the optical material in an amount in a range from about 0.5 to about 3 weight percent of the weight of the host material. In certain embodiments, quantum confined semiconductor nanoparticles are included in the optical material in an amount in a range from about 1 to about 3 weight percent of the weight of the host material. In certain embodiments, quantum confined semiconductor nanoparticles are included in the optical material in an amount in a range from about 1 to about 2 weight percent of the weight of the host material.

In certain embodiments, the optical material further comprises light scatterers.

In certain embodiments, the light scatterers comprise light scattering particles. In certain embodiments, light scattering particles are included in the optical material in an amount in a range from about 0.001 to about 5 weight percent of the weight of the host material. In certain embodiments, light scattering particles are included in the optical material in an amount in a range from about 0.5 to about 3 weight percent of the weight of the host material. In certain embodiments, light scattering particles are included in the optical material in an amount in a range from about 1 to about 3 weight percent of the weight of the host material. In certain embodiments, light scattering particles are included in the optical material in an amount in a range from about 1 to about 2 weight percent of the weight of the host material.

In certain embodiments, an optical component further includes a support element. Preferably, the support element is optically transparent to light emitted from the light source and to light emitted from the nanoparticles.

In certain embodiments, an optical component including a support element can serve as a cover plate for the solid state lighting device.

In certain embodiments, the support element comprises a light diffuser component of the solid state lighting device.

In certain embodiments, the support element is rigid.

In certain embodiments, the support element is flexible.

In certain embodiments, the optical material comprising quantum confined semiconductor nanoparticles is disposed over a surface of a support element. Preferably, the optical material is disposed over a surface of the support element facing the light source.

In certain embodiments, the optical material is disposed as one or more layers over a predetermined area of the surface of the support element.

In certain embodiments, the layer comprises an optical material that further includes a host material in which the quantum confined semiconductor nanoparticles are distributed. In certain embodiments, the layer includes from about 0.001 to about 5 weight percent quantum confined semiconductor nanoparticles based on the weight of the host material. In certain embodiments, the layer further comprises light scatterers. In certain embodiments, light scatterers are included in the layer in an amount in the range from about 0.001 to about 5 weight percent of the weight of the host material.

In certain embodiments, a layer including optical material including a host material has a thickness, for example, from about 0.1 micron to about 1 cm. In certain embodiments, a layer including optical material including a host material has a thickness from about 0.1 to about 200 microns. In certain embodiments, a layer including optical material including a host material has a thickness from about 10 to about 200 microns. In certain embodiments, a layer including optical material including a host material has a thickness from about 30 to about 80 microns.

In certain embodiments, the optical component can convert at least 10% of the emission in the blue spectral region to one or more predetermined wavelengths.

In certain embodiments, the optical component can convert at least 30% of the emission in the blue spectral region to one or more predetermined wavelengths.

In certain embodiments, the optical component can convert at least 60% of the emission in the blue spectral region to one or more predetermined wavelengths.

In certain embodiments, the optical component can convert at least 90% of the emission in the blue spectral region to one or more predetermined wavelengths.

In certain embodiments, the optical component can convert from about 50% to about 75% of the emission in the blue spectral region to one or more predetermined wavelengths.

In certain embodiments, quantum confined semiconductor nanoparticles included in an optical material are cadmium free.

In certain embodiments, quantum confined semiconductor nanoparticles included in an optical material comprise a III-V semiconductor material.

In certain embodiments, quantum confined semiconductor nanoparticles included in an optical material comprise a semiconductor nanocrystal including a core comprising a semiconductor material and an inorganic shell disposed on at least a portion of a surface of the core.

In certain embodiments, the optical material is at least partially encapsulated.

In certain embodiments, the optical material is fully encapsulated.

In accordance with another aspect of the present invention, there is provided a lighting fixture adapted to receive a solid state semiconductor light emitting device, wherein the fixture includes an optical component that is positioned in the fixture relative to the position for the light source such that at least a portion of the light generated by the light source passes into the optical component before being emitted from the fixture, wherein the optical component comprises an optical material capable of converting light having a first predetermined wavelength into light having a one or more different predetermined wavelengths in order to supplement the spectrum of the light emitted from the light source, and wherein the optical component comprises an optical material comprising quantum confined semiconductor nanoparticles.

In certain embodiments, the optical component is capable of converting a first predetermined wavelength in the blue spectral region into one or more different predetermined wavelengths in one or more spectral regions in which the light source has a deficiency.

In certain embodiments, for example, the optical component is capable of converting a first predetermined wavelength in the blue spectral region into one or more different predetermined wavelengths in the orange to red spectral region. In certain embodiments, the optical component is capable of converting a first predetermined wavelength in the blue spectral region into one or more different predetermined wavelengths in the red spectral region. In certain embodiments, the optical component is capable of converting a first predetermined wavelength in the blue spectral region into one or more different predetermined wavelengths in the cyan spectral region. In certain embodiments, the optical component is capable of converting a first predetermined wavelength in the blue spectral region into one or more different predetermined wavelengths in the red spectral region and one or more different predetermined wavelengths in the orange spectral region. In certain embodiments, for example, where a first predetermined wavelength is to be converted into more one or more different predetermined wavelengths, the optical material comprises one or more different types of quantum confined semiconductor nanoparticles (based on composition, structure and/or size), wherein each different type of quantum confined semiconductor nanoparticle can convert a portion of the first predetermined wavelength to one or more different predetermined wavelengths. In such case, one or more different predetermined wavelengths are selected to meet or compensate for one or more of the spectral deficiencies of the light source for which the cover plate in intended for use.

In certain embodiments including two or more different types of quantum confined semiconductor nanoparticles that emit at different predetermined wavelengths, the different types of quantum confined semiconductor nanoparticles can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments including two or more different optical materials, such different optical materials can, for example, be included as separate layers of a layered arrangement and/or as separate features of a patterned layer.

In certain embodiments, the optical material further comprises a host material in which the nanoparticles are distributed. In certain preferred embodiments the host material is a solid host material.

In certain embodiments, the optical material further includes light scatterers distributed in the material.

In certain embodiments, an optical component further includes a support element. Preferably, the support element is optically transparent to light emitted from the light source and to light emitted from the nanoparticles.

In certain embodiments, an optical component including a support element can serve as a cover plate for the lighting fixture.

In certain embodiments, the support element comprises a light diffuser component of the lighting fixture.

In certain embodiments, the support element is rigid.

In certain embodiments, the support element is flexible.

In certain embodiments, the lighting fixture includes an optical material described herein.

In certain embodiments, the lighting fixture includes an optical component taught herein.

In accordance with a further aspect of the present invention, there is provided a cover plate adapted for attachment to a lighting fixture for a solid state semiconductor light emitting device, the cover plate comprising an optically transparent base plate having an inner surface and an outer surface and a predetermined shape based on the design of the lighting fixture, an optical material disposed on a major surface of the base plate, and means for attaching the cover plate to the lighting fixture, wherein the optical material comprises quantum confined semiconductor nanoparticles capable of converting light having a first predetermined wavelength into one or more different predetermined wavelengths in order to supplement the spectrum of the light passing therethrough.

In certain embodiments, for example, where a first predetermined wavelength is to be converted into more one or more different predetermined wavelengths, the optical material comprises one or more different types of quantum confined semiconductor nanoparticles (based on composition, structure and/or size), wherein each different type of quantum confined semiconductor nanoparticle can convert a portion of the first predetermined wavelength to one or more different predetermined wavelengths. In such case, one or more different predetermined wavelengths are selected to meet or compensate for one or more of the spectral deficiencies of the light source for which the cover plate in intended for use.

In certain embodiments including two or more different types of quantum confined semiconductor nanoparticles that emit at different predetermined wavelengths, the different types of quantum confined semiconductor nanoparticles can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments including two or more different optical materials, such different optical materials can, for example, be included as separate layers of a layered arrangement and/or as separate features of a patterned layer.

In certain embodiments, optical material includes quantum confined semiconductor nanoparticles that are capable of converting a first predetermined wavelength in the blue spectral region and into one or more different predetermined wavelength in the red spectral region. In certain embodiments, the optical component is capable of converting a first predetermined wavelength in the blue spectral region into one or more different predetermined wavelengths in the orange to red spectral region. In certain embodiments, the optical component is capable of converting a first predetermined wavelength in the blue spectral region into one or more different predetermined wavelengths in the red spectral region. In certain embodiments, the optical component is capable of converting a first predetermined wavelength in the blue spectral region into one ore more different predetermined wavelengths in the cyan spectral region. In certain embodiments, the optical component is capable of converting a first predetermined wavelength in the blue spectral region into one ore more different predetermined wavelengths in the orange spectral region. In certain embodiments, the optical component is capable of converting a first predetermined wavelength in the blue spectral region into one or more predetermined wavelengths in the red spectral region and one or more different predetermined wavelengths in the orange spectral region. In certain embodiments, optical material comprises quantum confined semiconductor nanoparticles capable of emitting light in one or more other spectral regions in which the light source has a deficiency.

In certain embodiments, the optical material further comprises a host material in which the nanoparticles are distributed. In certain preferred embodiments the host material is a solid host material.

In certain embodiments, the optical material further includes light scattering particles distributed in the host material.

In certain embodiments, the optical material is at least partially encapsulated.

In certain embodiments, the optical material is fully encapsulated.

In certain embodiments, a cover plate comprises an optical material described herein.

In certain embodiments, a cover plate comprises an optical component taught herein.

In accordance with a further aspect of the present invention, there is provided a cover plate adapted for attachment to a solid state semiconductor light emitting device, the cover plate comprising an optically transparent base plate having an inner surface and an outer surface and a predetermined shape based on the design of the lighting device, an optical material disposed on a major surface of the base plate, and means for attaching the cover plate to the lighting device (preferably the lighting emitting face of the device), wherein the optical material comprises quantum confined semiconductor nanoparticles capable of converting light having a first predetermined wavelength into one or more different predetermined wavelengths in order to supplement the spectrum of the light passing therethrough.

In certain embodiments, for example, where a first predetermined wavelength is to be converted into more one or more different predetermined wavelengths, the optical material comprises one or more different types of quantum confined semiconductor nanoparticles (based on composition, structure and/or size), wherein each different type of quantum confined semiconductor nanoparticles can convert a portion of the first predetermined wavelength to one or more different predetermined wavelengths. In such case, one or more different predetermined wavelengths are selected to meet or compensate for one or more of the spectral deficiencies of the light source for which the cover plate in intended for use.

In certain embodiments including two or more different types of quantum confined semiconductor nanoparticles that emit at different predetermined wavelengths, the different types of quantum confined semiconductor nanoparticles can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments including two or more different optical materials, such different optical materials can, for example, be included as separate layers of a layered arrangement and/or as separate features of a patterned layer.

In certain embodiments, optical material includes quantum confined semiconductor nanoparticles that are capable of converting a first predetermined wavelength in the blue spectral region and into one or more different predetermined wavelength in the red spectral region. In certain embodiments, the optical component is capable of converting a first predetermined wavelength in the blue spectral region into one or more different predetermined wavelengths in the orange to red spectral region. In certain embodiments, the optical component is capable of converting a first predetermined wavelength in the blue spectral region into one or more different predetermined wavelengths in the red spectral region. In certain embodiments, the optical component is capable of converting a first predetermined wavelength in the blue spectral region into one or more different predetermined wavelengths in the cyan spectral region. In certain embodiments, the optical component is capable of converting a first predetermined wavelength in the blue spectral region into one ore more different predetermined wavelengths in the orange spectral region. In certain embodiments, the optical component is capable of converting a first predetermined wavelength in the blue spectral region into one or more predetermined wavelengths in the red spectral region and one or more different predetermined wavelengths in the orange spectral region. In certain embodiments, optical material comprises quantum confined semiconductor nanoparticles capable of emitting light in one or more other spectral regions in which the light source has a deficiency.

In certain embodiments, the optical material further comprises a host material in which the nanoparticles are distributed. In certain preferred embodiments the host material is a solid host material.

In certain embodiments, the optical material further includes light scattering particles distributed in the host material.

In certain embodiments, the optical material is at least partially encapsulated.

In certain embodiments, the optical material is fully encapsulated.

In certain embodiments, a cover plate comprises an optical material described herein.

In certain embodiments, a cover plate comprises an optical component taught herein.

In accordance with yet a further aspect of the present invention, there is provided a method for improving the lumens per watt efficiency of a white light emitting solid state semiconductor light emitting device having a spectral output including emissions in the blue and yellow spectral regions, the method comprising passing at least a portion of the blue emission into an optical material to convert at least a portion of the blue spectral emission into one or more emissions in a range from about 575 to about 650 nm, the optical material comprising quantum confined semiconductor nanoparticles.

In certain embodiments, for example, the optical material can convert at least a portion of the blue spectral emission into one or more emissions in a range from about 580 nm to about 630 nm, from about 590 nm to about 630 nm, from about 600 nm to about 620 nm, etc. In certain embodiments, the wavelength can be about 616 nm.

In certain embodiments, one or more different types of quantum confined semiconductor nanoparticles that emit at different predetermined wavelengths can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments, the method can include an optical material described herein.

In certain embodiments, the method can include an optical component taught herein.

In certain embodiments, including two or more different optical materials, such different optical materials can, for example, be included as separate layers of a layered arrangement and/or as separate features of a patterned layer.

In accordance with yet a further aspect of the present invention, there is provided a method for improving the lumens per watt efficiency of a white light emitting solid state semiconductor light emitting device having a spectral output including emissions in the blue and yellow spectral regions, the method comprising passing at least a portion of the blue emission into an optical material to convert at least a portion of the blue spectral emission into one or more emissions in a range from about 450 nm to about 500 nm, the optical material comprising quantum confined semiconductor nanoparticles.

In certain embodiments, the method can include an optical material described herein.

In certain embodiments, the method can include an optical component taught herein.

The foregoing, and other aspects and embodiments described herein all constitute embodiments of the present invention.

As used herein, "encapsulation" refers to protection against a particular element or compound, for example, oxygen and/or water. In certain embodiments, encapsulation can be complete (also referred to herein as full encapsulation). In certain embodiments, encapsulation can be less than complete (also referred to herein as partial encapsulation).

Additional information concerning quantum confined semiconductor nanoparticles, light scatterers, host materials, support elements, other features and elements of the foregoing, and other information useful with the present inventions is provided below.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

DETAILED DESCRIPTION OF THE INVENTION

Figure 1:
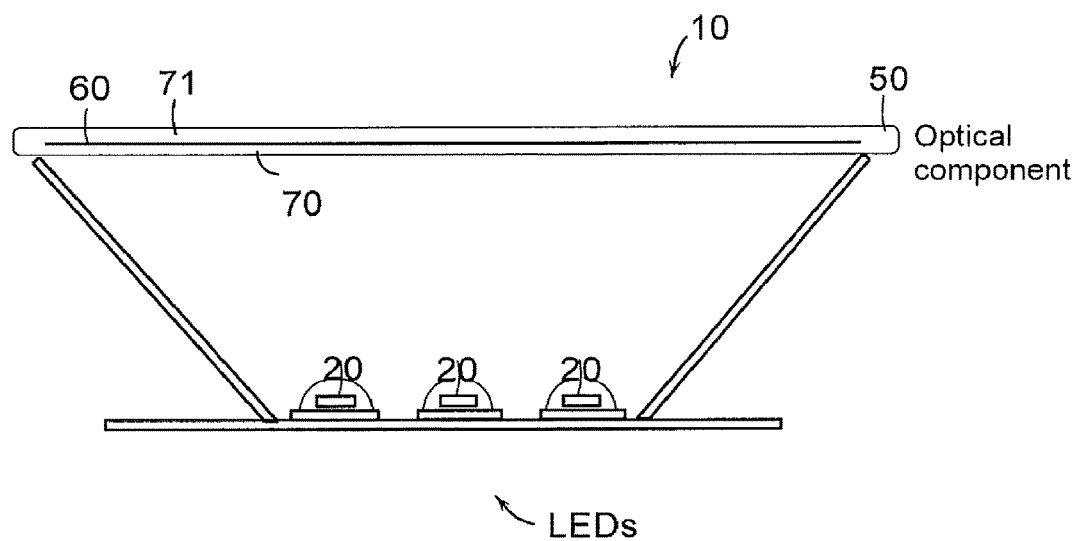
FIG. 1 is a schematic cross section of an example of an embodiment of a solid state lighting device of the invention.

Various aspects and embodiments of the present inventions will be further described in the following detailed description.

Quantum confined semiconductor nanoparticles can confine electrons and holes and have a photoluminescent property to absorb light and re-emit different wavelength light. Color characteristics of emitted light from quantum confined semiconductor nanoparticles depend on the size of the quantum confined semiconductor nanoparticles and the chemical composition of the quantum confined semiconductor nanoparticles.

Quantum confined semiconductor nanoparticles include at least one type of quantum confined semiconductor nanoparticle with respect to chemical composition, structure, and size. The type(s) of quantum confined semiconductor nanoparticles included in an optical component in accordance with the invention are determined by the wavelength of light to be converted and the wavelengths of the desired light output. As discussed herein, quantum confined semiconductor nanoparticles may or may not include a shell and/or a ligand on a surface thereof. In certain embodiments, a shell and/or ligand can passivate quantum confined semiconductor nanoparticles to prevent agglomeration or aggregation to overcome the Van der Waals binding force between the nanoparticles. In certain embodiments, the ligand can comprise a material having an affinity for any host material in which a quantum confined semiconductor nanoparticle may be included. As discussed herein, in certain embodiments, a shell comprises an inorganic shell.

In certain embodiments, one or more different types of quantum confined semiconductor nanoparticles (based on composition, structure, and/or size) may be included in a host material, wherein each type is selected to obtain light having a predetermined color.

In accordance with one aspect of the present invention, there is provided a solid state lighting device comprising a light source capable of emitting white light including a blue spectral component and having a deficiency in a spectral region, and an optical component that is positioned to receive at least a portion of the light generated by the light source, the optical component comprising an optical material for converting at least a portion of the blue spectral component of the light to one or more predetermined wavelengths such that light emitted by the solid state lighting device includes light emission from the light source is supplemented with light emission at one or more predetermined wavelengths, wherein the optical material comprises quantum confined semiconductor nanoparticles.

In certain embodiments, for example, wherein the light source emits white light with more than one spectral deficiency, the optical component can comprise an optical material including one or more different types of quantum confined semiconductor nanoparticles (based on composition, structure and/or size), wherein each different type of quantum confined semiconductor nanoparticle can convert a portion of the blue spectral component of the light to a predetermined wavelength that is different from the predetermined wavelength emitted by at least one of any other type of quantum confined semiconductor nanoparticles included in the optical material.

In certain embodiments including two or more different types of quantum confined semiconductor nanoparticles that emit at different predetermined wavelengths, the different types of quantum confined semiconductor nanoparticles can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments including two or more different optical materials, such different optical materials can, for example, be included as separate layers of a layered arrangement and/or as separate features of a patterned layer.

In other embodiments including two or more different types of quantum confined semiconductor nanoparticles that emit at different predetermined wavelengths, the different types of quantum confined semiconductor nanoparticles can be included in two or more different optical components in a stacked arrangement. In such embodiments, each optical component can include one or more optical materials as described above.

In embodiments including two or more different types of quantum confined semiconductor nanoparticles that emit at different predetermined wavelengths, light emitted by the solid state lighting device includes light emission that is supplemented with light emission at one or more different predetermined wavelengths. In such case, the two or more different predetermined wavelengths are selected to meet or compensate for one or more of the spectral deficiencies of the light source. For example, typical white-emitting semiconductor LEDs emit white light with spectral deficiencies, for example, in the red, orange, and cyan spectral regions of the spectrum.

In certain embodiments, a solid state lighting device can include an optical component for adding saturated red light to the light source light output. This can provide more saturated red color for the same power input, or equivalent red power for lower electrical power consumption.

In certain embodiments, a solid state lighting device can include an optical component for adding light in the orange to red spectral region (e.g., from about 575 nm to about 650 nm) to the light source output.

In certain embodiments, a solid state lighting device can add cyan light to the light source light output.

In certain embodiments, compensation of one or more spectral deficiencies of the light source by the optical component can also increase the General Color Rendering Index ($R_a$) of light output from the light source. For example, in certain embodiments, the optical component can increase the General Color Rendering Index ($R_a$) of light output from the light source by at least 10%. In certain embodiments, the General Color Rendering Index ($R_a$) is increased to a predetermined General Color Rendering Index ($R_a$).

In certain embodiments, compensation of one or more spectral deficiencies of the light source by the optical component can alter the correlated color temperature (CCT) of light output from the light source. In certain embodiments, the optical component can lower the correlated color temperature of light output from the light source by, for example, at least about 1000K; at least about 2000K, at least 3000K, at least 4000K, etc.

In certain embodiments, the lumens per watt efficiency of the light source is not substantially affected by alteration of the CCT through use of the optical component.

In certain embodiments, the CCT is altered to a predetermined CCT.

In certain embodiments, the CCT is altered to a predetermined CCT.

In certain preferred embodiments, quantum confined semiconductor nanoparticles comprise semiconductor nanocrystals.

In certain embodiments, the quantum confined semiconductor nanoparticles have a solid state quantum efficiency of at least 40%. In certain embodiments, the quantum confined semiconductor nanoparticles have a solid state quantum efficiency of at least 50%. In certain embodiments, the quantum confined semiconductor nanoparticles have a solid state quantum efficiency of at least 60%.

In certain embodiments, the quantum confined semiconductor nanoparticles maintain at least 40% efficiency during use of the optical component.

In certain preferred embodiments, the optical material comprises quantum confined semiconductor nanoparticles capable of emitting red light. In other certain preferred embodiments, the optical material comprises quantum confined semiconductor nanoparticles capable of emitting light in the orange to red spectral region.

In certain embodiments, an optical material comprises quantum confined semiconductor nanoparticles distributed in a host material. Preferably, the host material comprises a solid host material. Examples of a host material useful in various embodiments and aspect of the inventions described herein include polymers, monomers, resins, binders, glasses, metal oxides, and other nonpolymeric materials. Preferred host materials include polymeric and non-polymeric materials that are at least partially transparent, and preferably fully transparent, to preselected wavelengths of light. In certain embodiments, the preselected wavelengths can include wavelengths of light in the visible (e.g., 400-700 nm) region of the electromagnetic spectrum. Preferred host materials include cross-linked polymers and solvent-cast polymers. Examples of preferred host materials include, but are not limited to, glass or a transparent resin. In particular, a resin such as a non-curable resin, heat-curable resin, or photocurable resin is suitably used from the viewpoint of processability. As specific examples of such a resin, in the form of either an oligomer or a polymer, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like. Other suitable host materials can be identified by persons of ordinary skill in the relevant art.

In certain embodiments and aspects of the inventions contemplated by this disclosure, a host material comprises a photocurable resin. A photocurable resin may be a preferred host material in certain embodiments, e.g., embodiments in which the composition is to be patterned. As a photocurable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when the photo-sensitizer is not used. These resins may be used individually or in combination of two or more.

In certain embodiments and aspects of the inventions contemplated by this disclosure, a host material comprises a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like can be dissolved in solvents known to those skilled in the art. Upon evaporation of the solvent, the resin forms a solid host material for the semiconductor nanoparticles.

In certain embodiments, light scatterers and/or other additives (e.g., wetting or leveling agents) can also be included in optical material.

Examples of light scatterers (also referred to herein as scatterers or light scattering particles) that can be used in the embodiments and aspects of the inventions described herein, include, without limitation, metal or metal oxide particles, air bubbles, and glass and polymeric beads (solid or hollow). Other light scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO. Particles of other materials that are non-reactive with the host material and that can increase the absorption pathlength of the excitation light in the host material can be used. In certain embodiments, light scatterers may have a high index of refraction (e.g., $TiO_2$, $BaSO_4$, etc) or a low index of refraction (gas bubbles).

Selection of the size and size distribution of the scatterers is readily determinable by those of ordinary skill in the art. The size and size distribution can be based upon the refractive index mismatch of the scattering particle and the host material in which it the light scatterer is to be dispersed, and the preselected wavelength(s) to be scattered according to Rayleigh scattering theory. The surface of the scattering particle may further be treated to improve dispersability and stability in the host material. In one embodiment, the scattering particle comprises $TiO_2$ (R902+ from DuPont) of 0.2 µm particle size, in a concentration in a range from about 0.001 to about 5% by weight. In certain preferred embodiments, the concentration range of the scatterers is between 0.1% and 2% by weight.

In certain embodiments, an optical material including quantum confined semiconductor nanoparticles and a host material can be formed from an ink comprising quantum confined semiconductor nanoparticles and a liquid vehicle, wherein the liquid vehicle comprises a composition including one or more functional groups that are capable of being cross-linked The functional units can be cross-linked, for example, by UV treatment, thermal treatment, or another cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle. In certain embodiments, the ink can further include light scatterers.

In certain preferred embodiments of the inventions contemplated by this disclosure, quantum confined semiconductor nanoparticles (e.g., semiconductor nanocrystals) are distributed within the host material as individual particles.

In certain embodiments of an optical material further including a host material, quantum confined semiconductor nanoparticles included in an optical material in an amount is from about 0.001 to about 5 weight percent of the host material. In certain preferred embodiments, the optical material includes from about 0.1 to about 3 weight percent quantum confined semiconductor nanoparticles based on the weight of the host material. In certain more preferred embodiments, the composition includes from about 0.5 to about 3 weight percent quantum confined semiconductor nanoparticles based on the weight of the host material. In certain embodiments including light scatterers, the optical material includes from about 0.001 to about 5 weight percent scatterers based on the weight of the optical material.

In certain aspects and embodiments of the inventions taught herein, the optical component can further include a support element. In certain embodiments, optical material is disposed on the support element. In certain embodiments, optical material is disposed on a predetermined area of a surface of the support.

In certain embodiments, the support element is substantially optically transparent. In certain embodiments, the support element is at least 90% transparent. In certain embodiments, the support element is at least 95% transparent. In certain embodiments, the support element is at least 99% transparent.

In certain embodiments, the support element is optically translucent.

In certain embodiments the support element can comprise a rigid material, e.g., glass, polycarbonate, acrylic, quartz, sapphire, or other known rigid materials.

In certain embodiments, the support element can comprise a flexible material, e.g., a polymeric material such as plastic (e.g. but not limited to thin acrylic, epoxy, polycarbonate, PEN, PET, PE) or a silicone.

In certain embodiments, the support element can comprise a flexible material including a silica or glass coating thereon. Preferably the silica or glass coating is sufficiently thin to retain the flexible nature of the base flexible material.

In certain embodiments, the support element has a transmission haze (as defined in ASTM D1003-0095) in a range from about 0.1% to about 5%. (ASTM D1003-0095 is hereby incorporated herein by reference.) In certain embodiments, one or both of the major surfaces of the support element is smooth.

In certain embodiments, one or both major surfaces of the support element can be corrugated.

In certain embodiments, one or both major surfaces of the support element can be roughened.

In certain embodiments, one or both major surfaces of the support element can be textured.

In certain embodiments, one or both major surfaces of the support element can be concave.

In certain embodiments, one or both major surfaces of the support element can be convex.

In certain embodiments, one major surface of the support element can comprise microlenses.

In certain embodiments, the thickness of the carrier substrate is substantially uniform.

In certain embodiments, the geometrical shape and dimensions of a support element can be selected based on the particular end-use application.

In certain embodiments, an optical component includes at least one layer including one or more optical materials comprising quantum confined semiconductor nanoparticles.

In certain embodiments including more than one type of quantum confined semiconductor nanoparticles, each type can be included in a separate layer.

In certain embodiments, the optical material is disposed across a major surface of the support element.

In certain embodiments, the optical material is disposed as an uninterrupted layer across a major surface of the support element.

In certain embodiments, a layer of optical material can have a thickness from about 0.1 to about 200 microns. In certain embodiments, the thickness can be from about 10 to about 200 microns. In certain embodiments, the thickness can be from about 30 to about 80 microns.

In certain embodiments, other optional layers may also be included.

In certain embodiments, a layer can include two or more layers.

While further including may be undesirable for energy considerations, there may be instances in which a filter is included for other reasons. In such instances, a filter may be included. In certain embodiments, a filter may cover all or at least a predetermined portion of the support element. In certain embodiments, a filter can be included for blocking the passage of one or more predetermined wavelengths of light. A filter layer can be included over or under the optical material. In certain embodiments, an optical component can include multiple filter layers on various surfaces of the support element. In certain embodiments, a notch filter layer can be included.

In certain embodiments, one or more anti-reflection coatings can be included in the optical component.

In certain embodiments, one or more wavelength selective reflective coatings can be included in the optical component. Such coatings can, for example, reflect light back toward the light source.

In certain embodiments, for example, an optical component may further include outcoupling members or structures across at least a portion of a surface thereof. In certain embodiments, outcoupling members or structures may be uniformly distributed across a surface. In certain embodiments, outcoupling members or structures may vary in shape, size, and/or frequency in order to achieve a more uniform light distribution outcoupled from the surface. In certain embodiments, outcoupling members or structures may be positive, e.g., sitting or projecting above the surface of optical component, or negative, e.g., depressions in the surface of the optical component, or a combination of both.

In certain embodiments, an optical component can further include a lens, prismatic surface, grating, etc. on the surface thereof from which light is emitted. Other coatings can also optionally be included on such surface.

In certain embodiments, outcoupling members or structures can be formed by molding, embossing, lamination, applying a curable formulation (formed, for example, by techniques including, but not limited to, spraying, lithography, printing (screen, inkjet, flexography, etc), etc.).

In certain embodiments, a support element can include light scatterers.

In certain embodiments, a support element can include air bubbles or air gaps.

In certain embodiments, an optical component can include one or more major, surfaces with a flat or matte finish.

In certain embodiments, an optical component can include one or more surfaces with a gloss finish.

In certain aspects and embodiments of the inventions taught herein, an optical component can optionally further include a cover, coating or layer for protection from the environment (e.g., dust, moisture, and the like) and/or scratching or abrasion.

In certain embodiments, the optical material is at least partially encapsulated.

In certain embodiments, the optical material is at least partially encapsulated by a barrier material. In certain embodiments, the optical material is at least partially encapsulated by a=material that is substantially impervious to oxygen. In certain embodiments, the optical material is at least partially encapsulated by a material that is substantially impervious to moisture (e.g., water). In certain embodiments, the optical material is at least partially encapsulated by a material that is substantially impervious to oxygen and moisture. In certain embodiments, for example, the optical material can be sandwiched between substrates. In certain embodiments, one or both of the substrates can comprise glass plates. In certain embodiments, for example, the optical material can be sandwiched between a substrate (e.g., a glass plate) and a barrier film. In certain embodiments, the optical material can be sandwiched between two barrier films or coatings.

In certain embodiments, the optical material is fully encapsulated. In certain embodiments, for example, the optical material can be sandwiched between substrates (e.g., glass plates) that are sealed by a perimeter seal. In certain embodiments, for example, the optical material can be disposed on a substrate (e.g., a glass support) and fully covered by barrier film. In certain embodiments, for example, the optical material can be disposed on a substrate (e.g., a glass support) and fully covered by protective coating. In certain embodiments, the optical material can be sandwiched between two barrier films or coatings that are sealed by a perimeter seal.

Example of suitable barrier films or coatings include, without limitation, a hard metal oxide coating, a thin glass layer, and Barix coating materials available from Vitex Systems, Inc. Other barrier films or coating can be readily ascertained by one of ordinary skill in the art.

In certain embodiments, more than one barrier film or coating can be used to encapsulate the optical material.

Examples of light sources include, without limitation, solid state light emitting devices (preferably, a white-light emitting LED) A light source preferably emits in the visible region of the electromagnetic spectrum.

In certain embodiments, a system can include a single light source.

In certain embodiments, a system can include a plurality of light sources.

In certain embodiments including a plurality of light sources, the individual light sources can be the same or different.

In certain embodiments including a plurality of light sources, each individual light sources can emit light having a wavelength that is the same as or different from that emitted by each of the other light sources.

In certain embodiments including a plurality of light sources, the individual light sources can be arranged as an array.

In certain preferred embodiments, the white light emitting LED comprises a blue light emitting semiconductor LED including a phosphor material for converting the blue LED light output to white light.

In certain embodiments, for example, a blue light emitting LED component included in the white light emitting LED comprises e.g., (In)GaN blue.

In certain embodiments, a blue LED can emit light in a range from about 400 nm to about 500 nm.

In certain embodiments, the white light emitting LED comprises a UV light emitting semiconductor LED including a phosphor material for converting the UV LED light output to white light.

In certain embodiments, the weight ratio of quantum confined semiconductor nanoparticles to scatterers is from about 1:100 to about 100:1.

As described herein, in certain embodiments of the present invention, a solid state lighting device comprises a light source capable of generating light, and an optical component positioned to receive at least a portion of the light generated by the light source and convert at least a portion of the light so received to one or more predetermined wavelengths such that the light emitted by the solid state lighting device includes light emission from the light source supplemented with light emission at one or more predetermined wavelengths, wherein the optical component includes an optical material comprises quantum confined semiconductor nanoparticles.

In certain embodiments, the optical material is not in direct contact with the light source. In certain embodiments, the optical component is not in direct contact with the light source. Preferably the temperature at the location of the nanoparticles during operation of the solid state lighting device is less than 90° C., less than 75° C., 60° C. or less, 50° C. or less, 40° C. or less. In certain preferred embodiments, the temperature at the location of the nanoparticles during operation of the solid state lighting device is in a range from about 30° C. to about 60° C.

In certain embodiments, the light source comprises a white LED (e.g., a blue emitting semiconductor LED that is encapsulated with an encapsulant including phosphor material (e.g., typically a yellow phosphor material) for converting the blue LED light output to white), and the optical component comprises an optical material comprising quantum confined semiconductor nanoparticles capable of emitting red light.

In certain embodiments of a solid state lighting device in accordance with the invention that include, e.g., a light source comprising a white light emitting LED and an optical component comprising an optical material comprising quantum confined semiconductor nanoparticles that can emit light in the orange to red spectral region, an emission in the orange to red spectral region is added to the light output of the solid state lighting device. The addition of the nanoparticles with a predetermined emission wavelength in the spectral range from about 575 nm to about 650 nm can improve the lumens per watt efficiency of the solid state lighting device without increasing the power requirements thereof.

FIG. 1 depicts in schematic form an example of an embodiment of solid state lighting device 10 of the present disclosure. One or more light sources 20, depicted as a plurality of LEDs, are included in the solid state lighting device. In certain embodiments, the light source(s) comprises a white light emitting device that emits white light including a blue spectral component and having a deficiency in at least one spectral region. The solid state lighting device includes an optical component 50 positioned to receive at least a portion of the white light generated by the light source. The optical component comprises an optical material for converting at least a portion of the blue spectral component of the white light to one or more predetermined wavelengths such that light emitted by the solid state lighting device includes white light emission from the light source supplemented with light emission at one or more predetermined wavelengths in a deficient spectral region of the light source. The optical material comprises quantum confined semiconductor nanoparticles, and can further include light scattering particles. As described herein, in certain embodiments, quantum confined semiconductor nanoparticles included in an optical material comprise a semiconductor nanocrystal including a core comprising a semiconductor material and an inorganic shell disposed on at least a portion of a surface of the core. In the depicted example, the optical component is not in direct contact with the light sources. In the depicted example, the optical component includes a support element that can serve as a cover plate for the solid state lighting device. In certain embodiments, the support element comprises a light diffuser component of the solid state lighting device. In the depicted example, the optical component 50 includes a layer of optical material (as described herein) 60 disposed on a predetermined region of a first substrate (e.g., an optically transparent support element) 70 and covered by a second opposed substrate 71.

Figure 2:
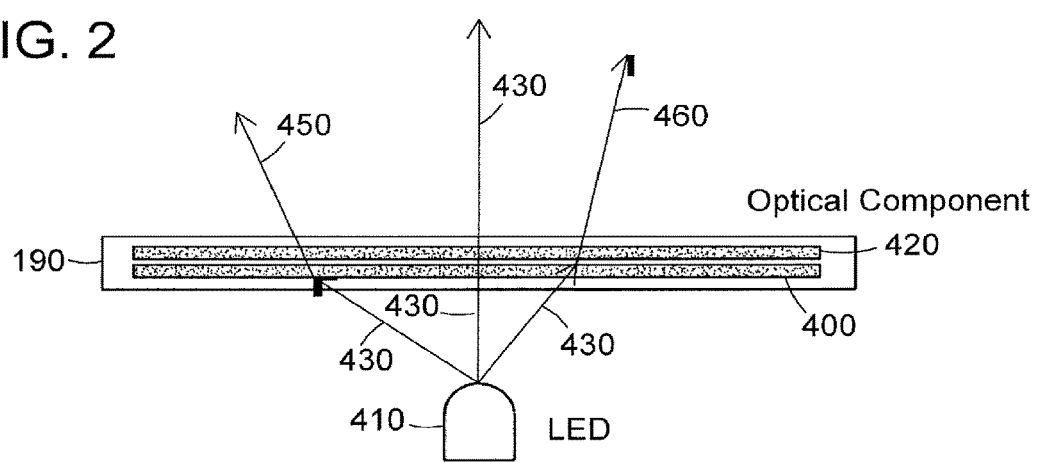
FIG. 2 is a schematic cross section of an example of an arrangement of a light source and an example of an embodiment of an optical component in accordance with the invention.

FIG. 2 depicts in schematic form an example of another embodiment of an optical component 190 including a layered arrangement of two different optical materials 400, 420, each including quantum confined semiconductor nanocrystals different from the other. The optical component 190 is positioned to receive at least a portion of the white light 430 generated by the light source 410, shown as an LED. The LED 410 emits white light 430 including a blue spectral component and having a deficiency in at least one spectral region. The optical material included in the optical component converts a portion of the blue spectral portion of the white light to one or more predetermined wavelengths to supplement the light source output 430 with light emission at one or more predetermined wavelengths 450, 460 in a deficient spectral region of the light source.

Advantageously, in certain embodiments of the present invention, an optical material comprising red-emitting quantum confined semiconductor nanoparticles can compensate for the red spectral deficiency while also lowering the correlated color temperature of a white light emitting LED. Such optical material can alter the light output from the light source such that the General Color Rendering Index ($R_a$) of the light output from the device is increased compared to that of light emitted directly from the light source. Such optical material can alter the light output from the light source such that the correlated color temperature of the light output from the device has a lower correlated color temperature than that of the light emitted directly from the light source.

General Color Rendering Index (which can be abbreviated as $R_a$), as used herein refers to the common definition of color rendering index as a mean value for 8 standard color samples ($R_{1-8}$).

In certain embodiments of a solid state lighting device in accordance with the invention that include, e.g., a light source comprising a white light emitting LED (including an LED emitting in the blue spectral region with a yellow phosphor film for creating a white LED output) and an optical component comprising an optical material comprising orange (e.g., about 575 nm to about 595 nm) emitting quantum confined semiconductor nanoparticles, an orange emission component is added to the light output of the solid state lighting device. The addition of the nanoparticles with a predetermined emission wavelength in the orange spectral region can improve the lumens per watt efficiency of the solid state lighting device without increasing the power requirements thereof.

In certain embodiments of a solid state lighting device in accordance with the invention that include, e.g., a light source comprising a white light emitting LED (including an LED emitting in the blue spectral region with a yellow phosphor film for creating a white LED output) and an optical component comprising an optical material comprising cyan emitting quantum confined semiconductor nanoparticles, a cyan emission component is added to the light output of the solid state lighting device. The addition of the nanoparticles with a predetermined emission wavelength in the cyan spectral region can improve the lumens per watt efficiency of the solid state lighting device without increasing the power requirements thereof as well as the CRI.

In accordance with another aspect of the present invention, there is provided an endoscopy light source comprising a solid state lighting device taught herein.

In accordance with another aspect of the present invention, there is provided an endoscopy light source comprising an optical component taught herein.

Endoscopic lighting devices and systems can be improved by including an optical component and/or a solid state lighting device taught herein. Performance of endoscopic systems can be enhanced by the characteristics of light obtainable from inclusion of an optical component described herein as a component of the endoscopic system for altering the light output of the system light source. Performance of endoscopic systems can be enhanced by the characteristics of light obtainable from inclusion of solid state lighting device described herein as a light source in such systems. Information concerning endoscopic systems can be found, for example, in U.S. Pat. Nos. 7,496,259; 7,488,101; and 7,466,885, the disclosures of which are hereby incorporated herein by reference in their entireties, In accordance with another aspect of the present invention, there is provided an optical component useful with a light source that emits white light including a blue spectral component and at least one spectral deficiency in another region of the spectrum, the optical component comprising an optical material for converting at least a portion of the blue spectral component of light output from the light source to one or more predetermined wavelengths, wherein the optical material comprises quantum confined semiconductor nanoparticles.

In certain preferred embodiments, a predetermined wavelength is selected to meet or compensate for a deficiency in the spectral region of the light source, for example, by supplementing the light output of the light source in at least one of the spectral deficiency regions.

In certain embodiments, for example, where a light source emits white light with a spectral deficiency in the red spectral region, the predetermined wavelength can be in a range from about 575 nm to about 650 nm, from about 580 nm to about 630 nm, from about 590 nm to about 630 nm, from about 600 nm to 620 nm, etc. In certain preferred embodiments, the wavelength is about 616 nm.

In certain embodiments, for example, where a light source emits white light with a spectral deficiency in the cyan spectral region, the optical material can comprise one or more different types of quantum confined semiconductor nanoparticles that can emit at one or more predetermined wavelengths in a range from about 450 nm to about 500 nm.

In certain embodiments, the optical component includes an optical material comprising one or more different types of quantum confined semiconductor nanoparticles (based on composition, structure and/or size), wherein each different type of quantum confined semiconductor nanoparticles emits light at predetermined wavelength that is different from the predetermined wavelength emitted by any other type of quantum confined semiconductor nanoparticles included in the optical material, and wherein one or more different predetermined wavelengths are selected such that the optical material will compensate for one or more spectral deficiencies of the intended light source.

In certain embodiments including one or more different types of quantum confined semiconductor nanoparticles that emit at different predetermined wavelengths, the different types of quantum confined semiconductor nanoparticles can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments including two or more different optical materials, such different optical materials can, for example, be included as separate layers of a layered arrangement and/or as separate features of a patterned layer.

In certain embodiments, compensation of one or more spectral deficiencies of the light source by the optical component can also increase the General Color Rendering Index ($R_a$) of light output from the light source. For example, in certain embodiments, the optical component can increase the General Color Rendering Index ($R_a$) of light output from the light source by at least 10%. In certain embodiments, the General Color Rendering Index ($R_a$) is increased to a predetermined General Color Rendering Index ($R_a$).

In certain embodiments, compensation of one or more spectral deficiencies of the light source by the optical component can alter the correlated color temperature (CCT) of light output from the light source. In certain embodiments, the optical component can lower the correlated color temperature of light output from the light source by, for example, at least about 1000K; at least about 2000K, at least 3000K, at least 4000K, etc.

In certain embodiments, the lumens per watt efficiency of the light source is not substantially affected by alteration of the CCT through use of the optical component.

In certain embodiments, the CCT is altered to a predetermined CCT.

In certain preferred embodiments, quantum confined semiconductor nanoparticles comprise semiconductor nanocrystals.

In certain embodiments, the quantum confined semiconductor nanoparticles have a solid state quantum efficiency of at least 40%. In certain embodiments, the quantum confined semiconductor nanoparticles have a solid state quantum efficiency of at least 50%. In certain embodiments, the quantum confined semiconductor nanoparticles have a solid state quantum efficiency of at least 60%.

In certain embodiments, the quantum confined semiconductor nanoparticles maintain at least 40% efficiency during use of the optical component.

In certain preferred embodiments, the optical material comprises quantum confined semiconductor nanoparticles capable of emitting red light. In other certain preferred embodiments, the optical material comprises quantum confined semiconductor nanoparticles capable of emitting light in the orange to red spectral region.

In certain embodiments, the optical material further comprises a host material in which the quantum confined semiconductor nanoparticles are distributed. In certain embodiments, quantum confined semiconductor nanoparticles are included in the optical material in an amount in a range from about 0.001 to about 5 weight percent of the weight of the host material. In certain embodiments, quantum confined semiconductor nanoparticles are included in the optical material in an amount in a range from about 0.5 to about 3 weight percent of the weight of the host material. In certain embodiments, quantum confined semiconductor nanoparticles are included in the optical material in an amount in a range from about 1 to about 3 weight percent of the weight of the host material. In certain embodiments, quantum confined semiconductor nanoparticles are included in the optical material in an amount in a range from about 1 to about 2 weight percent of the weight of the host material.

In certain embodiments, the optical material further comprises light scatterers.

In certain embodiments, the light scatterers comprise light scattering particles. In certain embodiments, light scattering particles are included in the optical material in an amount in a range from about 0.001 to about 5 weight percent of the weight of the host material. In certain embodiments, light scattering particles are included in the optical material in an amount in a range from about 0.5 to about 3 weight percent of the weight of the host material. In certain embodiments, light scattering particles are included in the optical material in an amount in a range from about 1 to about 3 weight percent of the weight of the host material. In certain embodiments, light scattering particles are included in the optical material in an amount in a range from about 1 to about 2 weight percent of the weight of the host material.

In certain embodiments, an optical component further includes a support element. Preferably, the support element is optically transparent to light emitted from the light source and to light emitted from the nanoparticles.

In certain embodiments, an optical component including a support element can serve as a cover plate for the solid state lighting device.

In certain embodiments, the support element comprises a light diffuser component of the solid state lighting device.

In certain embodiments, the support element is rigid.

In certain embodiments, the support element is flexible.

In certain embodiments, the geometrical shape and dimensions of a support element can be selected based on the particular end-use application (e.g., lamp, solid state lighting device, lighting fixture, or other apparatus or device).

In certain embodiments, the optical material comprising quantum confined semiconductor nanoparticles is disposed over a surface of a support element. Preferably, the optical material is disposed over a surface of the support element facing the light source.

In certain embodiments, the optical material is disposed as one or more layers over a predetermined area of the surface of the support element.

In certain embodiments, the layer comprises an optical material that further includes a host material in which the quantum confined semiconductor nanoparticles are distributed. In certain embodiments, the layer includes from about 0.001 to about 5 weight percent quantum confined semiconductor nanoparticles based on the weight of the host material. In certain embodiments, the layer further comprises light scatterers. In certain embodiments, light scatterers are included in the layer in an amount in the range from about 0.001 to about 5 weight percent of the weight of the host material.

In certain embodiments, a layer including optical material including a host material has a thickness, for example, from about 0.1 micron to about 1 cm. In certain embodiments, a layer including optical material including a host material has a thickness from about 0.1 to about 200 microns. In certain embodiments, a layer including optical material including a host material has a thickness from about 10 to about 200 microns. In certain embodiments, a layer including optical material including a host material has a thickness from about 30 to about 80 microns.

In certain embodiments, the optical component can convert at least 10% of the emission in the blue spectral region to one or more predetermined wavelengths.

In certain embodiments, the optical component can convert at least 30% of the emission in the blue spectral region to one or more predetermined wavelengths.

In certain embodiments, the optical component can convert at least 60% of the emission in the blue spectral region to one or more predetermined wavelengths.

In certain embodiments, the optical component can convert at least 90% of the emission in the blue spectral region to one or more predetermined wavelengths.

In certain embodiments, the optical component can convert from about 50% to about 75% of the emission in the blue spectral region to one or more predetermined wavelengths.

In certain embodiments, quantum confined semiconductor nanoparticles included in an optical material are cadmium free.

In certain embodiments, quantum confined semiconductor nanoparticles included in an optical material comprise a III-V semiconductor material.

In certain embodiments, quantum confined semiconductor nanoparticles included in an optical material comprise a semiconductor nanocrystal including a core comprising a semiconductor material and an inorganic shell disposed on at least a portion of a surface of the core.

In certain embodiments, the optical material is at least partially encapsulated.

In certain embodiments, the optical material is fully encapsulated.

In accordance with another aspect of the present invention, there is provided a lighting fixture adapted to receive a light source, wherein the fixture includes an optical component that is positioned in the fixture relative to the position of the light source such that at least a portion of the light generated by the light source passes into the optical component before being emitted from the fixture, wherein the optical component comprises an optical material capable of converting light having a first predetermined wavelength into light with having one or more different predetermined wavelengths in order to supplement the spectrum of the light emitted from the light source, wherein the optical component comprises an optical material comprising quantum confined semiconductor nanoparticles.

In certain embodiments, optical component is capable of converting a first predetermined wavelength in the blue spectral region into one or more different predetermined wavelengths in the red spectral region.

In certain embodiments, the optical component is capable of converting a first predetermined wavelength in the blue spectral region into one or more different predetermined wavelengths in the orange to red spectral region. In certain embodiments, the optical component is capable of converting a first predetermined wavelength in the blue spectral region into one or more different predetermined wavelengths in the red spectral region. In certain embodiments, the optical component is capable of converting a first predetermined wavelength in the blue spectral region into one more different predetermined wavelengths in the cyan spectral region. In certain embodiments, the optical component is capable of converting a first predetermined wavelength in the blue spectral region into one or more different predetermined wavelengths in the red spectral region and one or more different predetermined wavelengths in the orange spectral region.

In certain embodiments, the optical material further comprises a host material in which the nanoparticles are distributed. In certain preferred embodiments the host material is a solid host material.

In certain embodiments, the optical material further includes light scattering particles distributed in the host material.

In certain embodiments, the fixture can include the optical component and optical material taught herein.

In accordance with a further aspect of the present invention, there is provided a cover plate adapted for attachment to a solid state semiconductor light emitting device or a lighting fixture for a solid state semiconductor light emitting device, the cover plate comprising an optically transparent base plate having an inner surface and an outer surface and a predetermined shape based on the design of the device or lighting fixture, an optical material disposed on the surface (preferably the surface to face the light source) of the base plate, and means for attaching the cover plate to the device or lighting fixture, wherein the optical material comprises quantum confined semiconductor nanoparticles capable of converting light having a first predetermined wavelength into one or more different predetermined wavelengths in order to supplement the spectrum of the light passing therethrough.

In certain embodiments, for example, where a first predetermined wavelength is to be converted into more one or more different predetermined wavelengths, the optical material comprises one or more different types of quantum confined semiconductor nanoparticles (based on composition, structure and/or size), wherein each different type of quantum confined semiconductor nanoparticle can convert a portion of the first predetermined wavelength to one or more different predetermined wavelengths. In such case, one or more different predetermined wavelengths are selected to meet or compensate for one or more of the spectral deficiencies of the light source for which the cover plate in intended for use.

In certain embodiments including two or more different types of quantum confined semiconductor nanoparticles that emit at different predetermined wavelengths, the different types of quantum confined semiconductor nanoparticles can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments including two or more different optical materials, such different optical materials can, for example, be included as separate layers of a layered arrangement and/or as separate features of a patterned layer.

In certain embodiments, optical material includes quantum confined semiconductor nanoparticles that are capable of converting a first predetermined wavelength in the blue spectral region and into one or more different predetermined wavelength in the red spectral region. In certain embodiments, the optical component is capable of converting a first predetermined wavelength in the blue spectral region into one or more different predetermined wavelengths in the orange to red spectral region. In certain embodiments, the optical component is capable of converting a first predetermined wavelength in the blue spectral region into one or more different predetermined wavelengths in the red spectral region. In certain embodiments, the optical component is capable of converting a first predetermined wavelength in the blue spectral region into one or more different predetermined wavelengths in the cyan spectral region. In certain embodiments, the optical component is capable of converting a first predetermined wavelength in the blue spectral region into one or more different predetermined wavelengths in the red spectral region and one or more different predetermined wavelengths in the orange spectral region.

In certain embodiments, the optical material further comprises a host material in which the nanoparticles are distributed. In certain preferred embodiments the host material is a solid host material.

In certain embodiments, the optical material further includes light scattering particles distributed in the host material.

In certain embodiments, a cover plate comprises an optical component taught herein.

In certain embodiments, the cover plate can include an optical material taught herein.

In certain embodiments the cover plate can be flexible or rigid. In certain embodiments, the base plate can comprise materials useful for the above-described support element. In certain embodiments, a base plate can comprise one or more features and additional layers described above for the support element.

In certain embodiments and aspects of the inventions described herein, the geometrical shape and dimensions of a support element, an optical component, a base plate, and/or cover plate can be selected based on the particular end-use application.

In certain embodiments, the optical material is at least partially encapsulated.

In certain embodiments, the optical material is fully encapsulated.

In accordance with yet a further aspect of the present invention, there is provided a method for improving the lumens per watt efficiency of a white light emitting solid state semiconductor light emitting device having a spectral output including emissions in the blue and yellow spectral regions, the method comprising passing at least a portion of the blue emission into an optical material to convert at least a portion of the blue spectral emission to emission in a range from about 575 nm to about 650 nm, the optical material comprising quantum confined semiconductor nanoparticles.

In certain embodiments, for example, the optical material can convert at least a portion of the blue spectral emission to emission in a range from about 580 nm to about 630 nm, from about 590 nm to about 630 nm, from about 600 nm to about 620 nm, etc. In certain embodiments, the wavelength can be about 616 nm.

In certain embodiments including two or more different types of quantum confined semiconductor nanoparticles that emit at different predetermined wavelengths, the different types of quantum confined semiconductor nanoparticles can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain aspects and embodiments of the inventions taught herein, the optical material (e.g., comprising quantum confined semiconductor nanoparticles dispersed in a host material (preferably a polymer or glass)) is exposed to light flux for a period of time sufficient to increase the photoluminescent efficiency of the optical material. In certain embodiments, the optical material is exposed to light and heat for a period of time sufficient to increase the photoluminescent efficiency of the optical material. In certain embodiments, the exposure to light or light and heat is continued for a period of time until the photoluminescent efficiency reaches a substantially constant value. In certain embodiments, an LED light source with peak wavelength of about 450 nm is used as the source of light flux. Other known light sources can be readily identified by the skilled artisan. In certain embodiments, the light flux is from about 10 to about 100 mW/cm², preferably from about 20 to about 35 mW/cm², and more preferably from about 20 to about 30 mW/cm². In embodiments that include exposing the optical material to light and heat, the optical material is exposed to light while at a temperature in a range from about 25° to about 80° C. In certain embodiments, the optical material (e.g., comprising quantum confined semiconductor nanoparticles dispersed in a host material (preferably a polymer or glass)) can be encapsulated (for example, a layer of optical material can be disposed between glass plates, barrier films, or combinations thereof) when exposed to light, whether or not heat is also applied. In certain examples, the glass plates, barrier films, or combination thereof can further be sealed together around the perimeter or edge. In certain embodiments, the seal comprises barrier material. In certain embodiments, the seal comprises an oxygen barrier. In certain embodiments, the seal comprises a water barrier. In certain embodiments, the seal comprises an oxygen and water barrier. In certain embodiments, the seal is substantially impervious to water and/or oxygen. Examples of sealing techniques include, but are not limited to, glass-to-glass seal, glass-to-metal seal, sealing materials that are substantially impervious to oxygen and/or water, epoxies and other sealing materials that slow down penetration of oxygen and/or moisture. In certain embodiments, the optical material (e.g., comprising quantum confined semiconductor nanoparticles dispersed in a host material (preferably a polymer or glass)) can be partially encapsulated when exposed to light, whether or not heat is also applied.

Photoluminescent efficiency can be measured, for example, with use of a spectrophotometer in an integrating sphere including a NIST traceable calibrated light source. In such embodiments, the optical material can further include light scattering particles and other optional additives described herein.

The present invention will be further clarified by the following examples, which are intended to be exemplary of the present invention.

EXAMPLES

Example 1

Preparation of Semiconductor Nanocrystals Capable of Emitting Red Light with 3,5-di-tert-butyl-4-hydroxybenzylphosphonic acid Synthesis of CdSe Cores:

1 mmol cadmium acetate is dissolved in 8.96 mmol of tri-n-octylphosphine at 100° C. in a 20 mL vial and is then dried and degassed for one hour. 15.5 mmol of trioctylphosphine oxide and 2 mmol of octadecylphosphonic acid are added to a 3-neck flask and dried and degassed at 140° C. for one hour. After degassing, the Cd solution is added to the oxide/acid flask and the mixture is heated to 270° C. under nitrogen. Once the temperature reaches 270° C., 8 mmol of tri-n-butylphosphine is injected into the flask. The temperature is brought back to 270° C. where 1.1 mL of 1.5 M TBP-Se is then rapidly injected. The reaction mixture is heated at 270° C. for 15-30 minutes while aliquots of the solution are removed periodically in order to monitor the growth of the nanocrystals. Once the first absorption peak of the nanocrystals reaches 565-575 nm, the reaction is stopped by cooling the mixture to room temperature. The CdSe cores are precipitated out of the growth solution inside a nitrogen atmosphere glovebox by adding a 3:1 mixture of methanol and isopropanol. The cores are isolated and then dissolved in hexane for use in making core-shell materials.

Preparation of
3,5-Di-tert-butyl-4-hydroxybenzylphosphonic acid 3,5-Di-tert-butyl-4-hydroxybenzylphosphonic acid is obtained from PCI Synthesis, 9 Opportunity Way, Newburyport, Mass. 01950.

The preparation of 3,5-Di-tert-butyl-4-hydroxybenzylphosphonic acid generally utilizes the following synthetic approach:

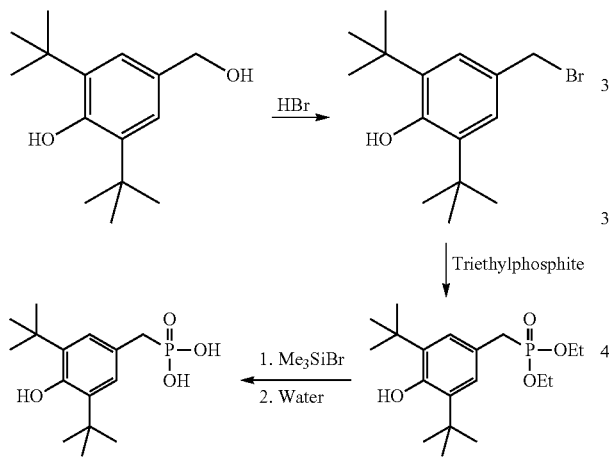

3,5-Di-tert-butyl-4-hydroxybenzylphosphonic acid can be characterized by the following:

Melting point: 199-200° C. [Lit: 200° C.; Literature ref: J. D. Spivack, FR1555941 (1969)] IR: 3614 cm$^{-1}$, 3593 cm$^{-1}$ (weak, O—H stretching).

$^1$H-NMR (CD$_3$OD): δ 7.10 (d, aromatic, 2H, J$_{P-H}$=2.6 Hz), 5.01 (s, exchanged HOD), 2.99 (d, —CH$_2$, 2H, J$_{P-H}$=21.2 Hz), 1.41 (s, —CH$_3$, 18H).

$^{13}$C-NMR (CD$_3$OD): δ 152.9 (aromatic), 137.9 (aromatic), 126.2 (aromatic), 123.5 (aromatic), 34.41 (d, —CH$_2$, 35.75, 33.07, J$_{P-C}$=537.2 Hz), 34.35 (—C(CH$_3$)$_3$), 29.7 (—C(CH$_3$)$_3$).

$^{31}$P-NMR (CD$_3$OD): δ 26.8

The above-identified synthetic precursors included in the preparation of 3,5-Di-tert-butyl-4-hydroxybenzylphosphonic acid can be characterized by the following:

Diethyl
3,5-di-tert-butyl-4-hydroxybenzylphosphonate

Melting point: 119-120° C. (Lit: 118-119° C.; Literature ref: R. K. Ismagilov, Zhur. Obshchei Khimii, 1991, 61, 387).

IR: 3451 cm$^{-1}$ (weak, —OH, stretching), 2953 (weak, —CH$_3$, C—H stretching).

$^1$H-NMR (CDCl$_3$): δ 7.066 (d, Ar—H, 2H, J$_{P-H}$=2.8 Hz), 5.145 (s, 1H, —OH), 4.06-3.92 (m, —CH$_2$CH$_3$, 4H, H—H and long-range P—H couplings), 3.057 (d, Ar—CH$_2$, 2H, J$_{P-H}$=21.0 Hz), 1.412 (s, —C(CH$_3$)$_3$, 18H), 1.222 (t, —CH$_2$CH$_3$, 6H).

$^{13}$C-NMR (CDCl$_3$): δ 153.98 (aromatic), 136.22 (aromatic), 126.61 (aromatic), 122.07 (aromatic), 62.14 (—O CH$_2$CH$_3$, J$_{P-C}$=24.4 Hz), 33.63 (Ar—CH$_2$, J$_{P-C}$=552.4 Hz), 34.53 [—C(CH$_3$)$_3$], 30.54 [—C(CH$_3$)$_3$], 16.66 (—CH$_2$CH$_3$, J$_{P-C}$=24.4 Hz).

$^{31}$P-NMR (CDCl$_3$): δ 28.43.

3,5-di-tert-butyl-4-hydroxybenzyl bromide

Melting point: 51-54° C. (Lit: 52-54° C.; Literature ref: J. D. McClure, J. Org. Chem., 1962, 27, 2365)

IR: 3616 cm$^{-1}$ (medium, O—H stretching), 2954 cm$^{-1}$ (weak, alkyl C—H stretching).

$^1$H-NMR (CDCl$_3$): δ 7.20 (s, Ar—H, 2H), 5.31 (s, —OH), 4.51 (s, —CH$_2$, 2H), 1.44 {s, [—C(CH$_3$)$_3$], 18H}.

$^{13}$C-NMR (CDCl$_3$): δ 154.3 (aromatic), 136.5 (aromatic), 128.7 (aromatic), 126.3 (aromatic), 35.8 [(—C(CH$_3$)$_3$], 34.6 (—CH$_2$), 30.5 [—C(CH$_3$)$_3$].

Other synthetic approaches that are known or readily ascertainable by one of ordinary skill in the relevant art can be used to prepare 3,5-Di-tert-butyl-4-hydroxybenzylphosphonic acid.

Synthesis of CdSe/CdZnS Core-Shell Nanocrystals:

25.86 mmol of trioctylphosphine oxide and 2.4 mmol of 3, 5-di-tert-butyl-4-hydroxybenzylphosphonic acid are loaded into a four-neck flask. The mixture is then dried and degassed in the reaction vessel by heating to 120° C. for about an hour. The flask is then cooled to 75° C. and the hexane solution containing isolated CdSe cores (0.1 mmol Cd content) is added to the reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S is in two-fold excess relative to the Cd and Zn. The Cd/Zn and S samples are each dissolved in 4 mL of trioctylphosphine inside a nitrogen atmosphere glove box. Once the precursor solutions are prepared, the reaction flask is heated to 155° C. under nitrogen. The precursor solutions are added dropwise over the course of 2 hours at 155° C. using a syringe pump. After the shell growth, the nanocrystals are transferred to a nitrogen atmosphere glovebox to be precipitated out of the growth solution by adding a 3:1 mixture of methanol and isopropanol. The core-shell nanocrystals are then isolated and dispersed in fluorobenzene and used to make an optical material.

(3,5-di-tert-butyl-4-hydroxybenzylphosphonic acid ligand group may also be referred to herein as BHT.)

Example 2

Preparation of Optical Component Including Semiconductor Nanocrystals

The film listed in the Table below is prepared using optical material including semiconductor nanocrystals (prepared substantially in accordance with the synthesis described in Example 1).

The red-emitting semiconductor nanocrystals dispersed in solvent have a peak emission at 609 nm, a FWHM of 31, a solution quantum yield of 77% and a concentration of 21 mg/ml.

0.5 ml of RD-12, a low viscosity reactive diluent commercially available from Radcure Corp, 9 Audrey Pl, Fairfield, N.J. 07004-3401, United States, is added to a 20 ml septum capped vial including a magnetic stirrer bar, the system is closed and purged through a syringe needle under vacuum then backfilled with nitrogen. 2.6 ml of the 21 mg/ml suspension of the red-emitting nanocrystals is added to the vial by a 3 ml syringe. Solvent is removed from the vial by vacuum stripping. 2 ml of DR-150 is then added to the vial through a syringe and the mixture is mixed using a Vortex mixer. (DR-150 is a UV-curable acrylic formulation commercially available from Radcure). The vessel is then backfilled with nitrogen and the mixture is mixed using a Vortex mixer.

0.028 gram $TiO_2$ is next added to the open vial and the mixture is mixed with a Vortex mixer followed by mixing with an homogenizer.

The vial is then capped and deaerated under vacuum and backfilled with nitrogen.

After mixing, the closed vial is put in an ultrasonic bath for 50 minutes. Care is taken to avoid temperatures over 40° C. while the sample is in the ultrasonic bath.

The sample is stored in the dark until used to make a coating.

Tego 2500 is added before forming films on polycarbonate.

Sample material from the vial is Mayer rod coated onto a corona treated precleaned 1 mm thick sheet of transparent polycarbonate and cured in a 5000-EC UV Light Curing Flood Lamp from DYMAX Corporation system with an H-bulb (225 mW/cm$^2$) for 20 seconds. The thickness of the nanocrystal containing layer on the polycarbonate is approximately 30 microns.

The resulting film is cut to size to serve as cover plates on white light emitting Array PAR 30 LED lamps available from NEXXUS Lighting.

Data for Array PAR 30 LED lamps (available from NEXXUS Lighting) with and without an optical component comprising the above-prepared cover plates is provided in the following Table 1:

TABLE 1

| | LUMENS | CORRELATED COLOR TEMPERATURE | GENERAL CRI ($R_a$) |
|---|---|---|---|
| Array PAR 30 LED Lamp (5000 K) without nanocrystal containing cover plate | 342 | 5079 | 76.4 |
| Array PAR 30 LED Lamp (5000 K) with nanocrystal containing cover plate (as described in above example) | 220 | 2712 | 89.6 |
| Array PAR 30 LED Lamp (6500 K) without nanocrystal containing cover plate | 366 | 6412 | 75.7 |

TABLE 1-continued

| | LUMENS | CORRELATED COLOR TEMPERATURE | GENERAL CRI ($R_a$) |
|---|---|---|---|
| Array PAR 30 LED Lamp (6500 K) with nanocrystal containing cover plate (as described in above example) | 224 | 3031 | 91.3 |

Example 3

Preparation of Semiconductor Nanocrystals Capable of Emitting 611 nm Light with 3,5-di-tert-butyl-4-hydroxybenzylphosphonic acid Synthesis of CdSe Cores:

29.9 mmol cadmium acetate is dissolved in 436.7 mmol of tri-n-octylphosphine at 100° C. in a 250 mL 3-neck round-bottom flask and then dried and degassed for one hour. 465.5 mmol of trioctylphosphine oxide and 61.0 mmol of octadecylphosphonic acid are added to a 0.5 L glass reactor and dried and degassed at 140° C. for one hour. After degassing, the Cd solution is added to the reactor containing the oxide/acid and the mixture is heated to 270° C. under nitrogen. Once the temperature reaches 270° C., 243.2 mmol of tri-n-butylphosphine is injected into the flask. The temperature is brought back to 270° C. where 34 mL of 1.5 M TBP-Se is then rapidly injected. The reaction mixture is heated at 250° C. for 9 minutes at which point the heating mantle is removed from the reaction flask and the solution is allowed to cool to ambient temperature. Once the first absorption peak of the nanocrystals reaches about 558 nm, the reaction is stopped by cooling the mixture to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials.

Synthesis of CdSe/CdZnS Core-Shell Nanocrystals:

Two identical reactions are set up whereby 25.86 mmol of trioctylphosphine oxide and 2.4 mmol of 3,5-di-tert-butyl-4-hydroxybenzylphosphonic acid are loaded into 50 mL four-neck round bottom flasks. The mixtures are then dried and degassed in the reaction vessels by heating to 120° C. for about an hour. The flasks are then cooled to 70° C. and the hexane solution containing isolated CdSe cores (0.096 mmol Cd content) are added to each reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S is in two-fold excess relative to the Cd and Zn. Two sets of Cd/Zn (0.29 mmol of dimethylcadmium and diethylzinc) and S (1.15 mmol of hexamethyldisilathiane) samples are each dissolved in 4 mL of trioctylphosphine inside a nitrogen atmosphere glove box. Once the precursor solutions are prepared, the reaction flasks are heated to 155° C. under nitrogen. The Cd/Zn and S precursor solutions are added dropwise to the respective reaction flasks over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dispersed in toluene.

Example 4

Preparation of Optical Component Including Semiconductor Nanocrystals

The following film is prepared using optical material including semiconductor nanocrystals (prepared substantially in accordance with the synthesis described in Example 3).

The semiconductor nanocrystals comprise red-emitting semiconductor nanocrystals dispersed in toluene and have a peak emission at 611 nm, a FWHM of about 32 nm, a solution quantum yield of 70% and a concentration of 20.4 mg/ml.

5.5 ml of the 20.4 mg/ml suspension of the red-emitting nanocrystals is added from a 6 mL syringe to a 20 ml septum capped vial including a magnetic stirrer bar, the system is closed and purged through a syringe needle under vacuum then backfilled with nitrogen. Approximately half of the solvent is removed from the vial by vacuum stripping. 1.0 ml of RD-12, a low viscosity reactive diluent commercially available from Radcure Corp, 9 Audrey Pl, Fairfield, N.J. 07004-3401 is added. 4.0 ml of DR-150 is then added to the vial through a syringe and the mixture is mixed using a Vortex mixer. (DR-150 is a UV-curable acrylic formulation commercially available from Radcure.)

0.3 ml of a 10% solution of Tego 2500 in toluene is added to the mixture by syringe while mixing. Remaining solvent is removed from the vial by vacuum stripping.

The vessel is then backfilled with nitrogen and the mixture is mixed using a Vortex mixer.

0.056 gram $TiO_2$ (Ti-Pure 902+ available from DuPont) is next added to the open vial and the mixture is mixed with a Vortex mixer followed by mixing with an homogenizer.

The vial is then capped and deaerated under vacuum and backfilled with nitrogen.

After mixing, the closed vial is put in an ultrasonic bath for 50 minutes. Care is taken to avoid temperatures over 40° C. while the sample is in the ultrasonic bath.

The sample is stored in the dark until used to make a coating.

Sample material from the vial is screen-printed onto a corona treated precleaned (using an isopropanol wipe) 1.4 mm thick polycarbonate (1% transmission haze) hexagonal cover plate and cured in a 5000-EC UV Light Curing Flood Lamp from DYMAX Corporation system with an H-bulb (225 mW/cm$^2$) for 20 seconds. The thickness of the nanocrystal containing layer on the polycarbonate is approximately 32 microns.

The resulting cover plate is included as the face plate of a white light emitting Array PAR 30 LED lamp available from NEXXUS Lighting.

Example 5

Preparation of Semiconductor Nanocrystals

A. Preparation of Semiconductor Nanocrystals Capable of Emitting 588 nm Light with 3,5-di-tert-butyl-4-hydroxybenzylphosphonic acid Synthesis of CdSe Cores: 1.75 mmol cadmium acetate is dissolved in 15.7 mmol of tri-n-octylphosphine at 140° C. in a 20 mL vial and then dried and degassed for one hour. 31.0 mmol of trioctylphosphine oxide and 4 mmol of octadecylphosphonic acid are added to a 3-neck flask and dried and degassed at 110° C. for one hour. After degassing, the Cd solution is added to the oxide/acid flask and the mixture is heated to 270° C. under nitrogen. Once the temperature reaches 270° C., 16 mmol of tri-n-butylphosphine is injected into the flask. The temperature is brought back to 270° C. where 2.3 mL of 1.5 $\underline{M}$ TBP-Se is then rapidly injected. The reaction mixture is heated at 270° C. for 30 seconds and then the heating mantle is removed from the reaction flask allowing the solution to cool to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials. (Abs/Emission/FWHM (nm)=518/529/26.5).

Synthesis of CdSe/CdZnS Core-Shell Nanocrystals: Two identical reactions are set up whereby 25.86 mmol of trioctylphosphine oxide and 2.4 mmol of 3,5-di-tert-butyl-4-hydroxybenzylphosphonic acid are loaded into 50 mL four-neck round bottom flasks. The mixtures are then dried and degassed in the reaction vessels by heating to 120° C. for about an hour. The flasks are then cooled to 70° C. and the hexane solution containing isolated CdSe cores from above (0.062 mmol Cd content) are added to the respective reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S was in two-fold excess relative to the Cd and Zn. Two sets of Cd/Zn (0.31 mmol of dimethylcadmium and diethylzinc) and S (1.24 mmol of hexamethyldisilathiane) samples are each dissolved in 4 mL of trioctylphosphine inside a nitrogen atmosphere glove box. Once the precursor solutions are prepared, the reaction flasks are heated to 155° C. under nitrogen. The Cd/Zn and S precursor solutions are added dropwise to the respective reaction flasks over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dispersed in toluene and the solutions from the two batches are combined B. Preparation of Semiconductor Nanocrystals Capable of Emitting 632 nm Light with 3,5-di-tert-butyl-4-hydroxybenzylphosphonic acid Synthesis of CdSe Cores: 29.9 mmol cadmium acetate is dissolved in 436.7 mmol of tri-n-octylphosphine at 140° C. in a 250 mL 3-neck round-bottom schlenk flask and then dried and degassed for one hour. 465.5 mmol of trioctylphosphine oxide and 61.0 mmol of octadecylphosphonic acid are added to a 0.5 L glass reactor and dried and degassed at 120° C. for one hour. After degassing, the Cd solution is added to the reactor containing the oxide/acid and the mixture is heated to 270° C. under nitrogen. Once the temperature reaches 270° C., 243.2 mmol of tri-n-butylphosphine is injected into the flask. The temperature is brought back to 270° C. where 33.3 mL of 1.5 $\underline{M}$ TBP-Se is then rapidly injected. The reaction mixture is heated at 270° C. for ~9 minutes at which point the heating mantle is removed from the reaction flask and the mixture is allowed to cool to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials. (Abs/Emission/FWHM (nm)=571/592/45)

Synthesis of CdSe/CdZnS Core-Shell Nanocrystals: Three identical reactions are conducted whereby 517.3 mmol of trioctylphosphine oxide and 48.3 mmol of 3,5-di-tert-butyl-4-hydroxybenzylphosphonic acid are loaded into a 0.5 L glass reactor. The mixtures are then dried and degassed in the reactor by heating to 120° C. for about an hour. The reactors are then cooled to 70° C. and hexane solutions containing the isolated CdSe cores from above (1.95 mmol Cd content) are added to the respective reaction mixtures. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S was in two-fold excess relative to the Cd and Zn. Two sets of Cd/Zn (5.5 mmol of dimethylcadmium and diethylzinc) and S (22 mmol of hexamethyldisilathiane) samples are each dissolved in 80 mL of trioctylphosphine inside a nitrogen atmosphere glove box. Once the precursor solutions are prepared, the reaction flasks are heated to 155° C. under nitrogen. The precursor solutions are added dropwise the respective reactor solutions over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The resulting precipitates are then dispersed in hexane and precipitated out of solution for a second time by adding a 3:1 mixture of methanol and isopropanol. The isolated core-shell nanocrystals are then dissolved in chloroform and the solutions from the three batches are mixed. (Abs/Emission/FWHM (nm)=610/632/40)

Example 6

Preparation of Optical Component Including Two Different Types of Semiconductor Nanocrystals The following film is prepared using optical material including semiconductor nanocrystals (prepared substantially in accordance with the synthesis described in Example 5).

A. Optical Material Including Semiconductor Nanocrystals with a Peak Emission in the Orange Spectral Region:

The semiconductor nanocrystals prepared substantially in accordance with the synthesis described in Example 5A comprise orange-emitting semiconductor nanocrystals dispersed in Fluorobenzene have a peak emission at 588 nm, a FWHM of about 28 nm, a solution quantum yield of 83% and a concentration of 20 mg/ml.

2.7 ml of the 20 mg/ml suspension of the red-emitting nanocrystals is added from a 3 mL syringe to a 20 ml septum capped vial including a magnetic stirrer bar, the system is closed and purged through a syringe needle under vacuum then backfilled with nitrogen. Approximately 90 percent of the solvent is removed from the vial by vacuum stripping. 0.5 ml of RD-12, a low viscosity reactive diluent commercially available from Radcure Corp, 9 Audrey Pl, Fairfield, N.J. 07004-3401 is added. Remaining solvent is removed from the vial by vacuum stripping. 2.0 ml of DR-150 is then added to the vial through a syringe and the mixture is mixed using a Vortex mixer. (DR-150 is a UV-curable acrylic formulation commercially available from Radcure). The mixture is then placed in an ultrasonic bath for approximately 15 minutes.

0.028 gram $TiO_2$ (Ti-Pure 902+ available from DuPont) is next added to the open vial and the mixture is mixed with a Vortex mixer followed by mixing with an homogenizer.

The vial is then capped and deaerated under vacuum and backfilled with nitrogen.

After mixing, the closed vial is put in an ultrasonic bath for 50 minutes. Care is taken to avoid temperatures over 40° C. while the sample is in the ultrasonic bath.

The sample is stored in the dark until used to make a combined formulation with long wavelength semiconductor and additional matrix material.

B. Optical Material Including Semiconductor Nanocrystals with a Peak Emission in the Red Spectral Region:

The semiconductor nanocrystals prepared substantially in accordance with the synthesis described in Example 5B comprise orange-emitting semiconductor nanocrystals dispersed in Chloroform and have a peak emission at 632 nm, a FWHM of about 40 nm, a solution quantum yield of 70% and a concentration of 56.7 mg/ml.

99 ml of the 56.7 mg/ml suspension of the red-emitting nanocrystals is added to a septum capped Erlenmeyer flask including a magnetic stirrer bar, the system is closed and purged through a syringe needle under vacuum then backfilled with nitrogen. Approximately 95 percent of the solvent is removed from the vial by vacuum stripping. 46.6 ml of RD-12, a low viscosity reactive diluent commercially available from Radcure Corp, 9 Audrey Pl, Fairfield, N.J. 07004-3401 is added. Remaining solvent is removed from the vial by vacuum stripping. 187 ml of DR-150 is then added to the vial through a syringe and the mixture is mixed using a Vortex mixer. (DR-150 is a UV-curable acrylic formulation commercially available from Radcure). The mixture is then placed in an ultrasonic bath for approximately 50 minutes.

Approximately 2.6 gram $TiO_2$ (Ti-Pure 902+ available from DuPont) is next added to the open vial as well as 12.9 grams of Esacure TPO previously ground to reduce particle size in a ball mill machine and the mixture is mixed with a Vortex mixer followed by mixing with an homogenizer.

The vial is then capped and deaerated under vacuum and backfilled with nitrogen.

After mixing, the closed vial is put in an ultrasonic bath for 60 minutes. Care is taken to avoid temperatures over 40° C. while the sample is in the ultrasonic bath. The sample is stored in the dark until used to make a combined formulation with long wavelength semiconductor and additional matrix material.

C. Preparation of Host Material Including Spacer Beads:

0.9 ml of RD-12, a low viscosity reactive diluent commercially available from Radcure Corp, 9 Audrey Pl, Fairfield, N.J. 07004-3401 and 3.8 ml of DR-150, also available from Radcure Corp, is added to a 20 ml vial and the mixture is mixed using a Vortex mixer. The mixture is then placed in an ultrasonic bath for approximately 30 minutes.

Approximately 0.05 gram $TiO_2$ (Ti-Pure 902+ available from DuPont) is next added to the open vial as well as 0.05 grams of GL0179B6/45 space beads available from MO-SCI Specialty Products, Rolla, Mo. 65401 USA, and then mixed using a Vortex mixer.

After mixing, the closed vial is put in an ultrasonic bath for approximately 50 minutes. Care is taken to avoid temperatures over 40° C. while the sample is in the ultrasonic bath. The sample is stored in the dark until used to make a combined formulation with long wavelength semiconductor and additional matrix material.

D. Preparation of Optical Material & Layer Including Red and Orange Emitting Semiconductor Nanocrystals:

An optical material is formed by adding together in a 20 ml vial, 2.52 grams of the host material including spacer beads (prepared substantially in accordance with the procedure described in Example 6C), 0.99 grams of the optical material of Example 6B and 1.01 grams of the optical material of Example 6A. The mixture was stirred using a Vortex mixer followed by sonification in an ultrasonic bath for approximately 50 minutes.

Sample material from the combination vial is dispensed onto a Hexagon shaped flat Borosilicate glass which was previously cleaned using a caustic base bath, acid rinse, deionized water rinse, and a methanol wipe. A second Hexagon plate of the same size also previously cleaned is placed on top of the dispensed sample material and the sandwiched structure is massaged to spread the formulation evenly between the two glass plates. Excess formulation which squeezed out of the structure is wiped off of the outer portion of the glass and the Hexagon sandwich is cured in a 5000-EC UV Light Curing Flood Lamp from DYMAX Corporation system with an H-bulb (225 mW/cm$^2$) for 10 seconds. The thickness of the nanocrystal containing layer is comprises approximately 70-79 μm (approximately 360 mg of formulation).

The Hexagon sandwich consisting of two Hexagon shaped flat plates of Borosilicate glass with cured layer of acrylic containing a sample of the optical material prepared substantially as described in Example 6.

Six samples (Samples A-F) were prepared substantially as described in Example 6. Initial CCT, CRI, and External Quantum Efficiency measurements were taken for each sample prior to heating each sample to approximately 50° C. and irradiating the sample with approximately 30 mW/cm2 of 450 nm blue light for the time specified in following Table 2 for each of the samples. CCT, CRI, and EQE measurements were taken after the irradiation time listed for the respective sample. The data is set forth in the following Table 2.

TABLE 2

| Sample Label | Initial CCT (K) | Initial CRI | Initial EQE (%) | Irradiation at 50° C. @ 30 mW/cm2 Irradiation Time, Hrs | Final CCT (K) | Final CRI | Final EQE (%) |
|---|---|---|---|---|---|---|---|
| A | 2649 | 86.5 | 62 | 1 | 2482 | 87.1 | 78 |
| B | 2664 | 85.6 | — | 13 | 2519 | 87 | 82 |
| C | 2609 | 85.6 | 65 | 2 | 2444 | 87.1 | 77 |
| D | 2641 | 85.4 | 62 | 10 * | 2472 | 87.2 | 80 |
| E | 2659 | 85.2 | 63 | 11 | 2480 | 87.3 | 80 |
| F | 2684 | 84.5 | 60 | 11 | 2446 | 87.3 | 80 |

* 2 hrs 50 C. @ 30 mW/cm2 450 nm, 8 hrs 50 C. @ 15 mW/cm2 450 nm

Because semiconductor nanocrystals have narrow emission linewidths, are photoluminescent efficient, and emission wavelength tunable with the size and/or composition of the nanocrystals, they are preferred quantum confined semiconductor nanoparticles for use in the various aspects and embodiments of the inventions described herein.

The size and composition of quantum confined semiconductor nanoparticles (including, e.g., semiconductor nanocrystals) useful in the various aspects and embodiments of the inventions can be selected such that semiconductor nanocrystals emit photons at a predetermined wavelength of wavelength band in the far-visible, visible, infra-red or other desired portion of the spectrum. For example, the wavelength can be between 300 and 2,500 nm or greater, such as between 300 and 400 nm, between 400 and 700 nm, between 700 and 1100 nm, between 1100 and 2500 nm, or greater than 2500 nm.

Quantum confined semiconductor nanoparticles (including, e.g., semiconductor nanocrystals) are nanometer-scale inorganic semiconductor nanoparticles. Semiconductor nanocrystals include, for example, inorganic crystallites between about 1 nm and about 1000 nm in diameter, preferably between about 2 nm and about 50 um, more preferably about 1 nm to about 20 nm (such as about 6, 7, 8, 9, 10, 11, 12, 13, 14, 15, 16, 17, 18, 19, or 20 nm).

Semiconductor nanocrystals included in various aspect and embodiments of the inventions most preferably have an average nanocrystal diameter less than about 150 Angstroms (Å). In certain embodiments, semiconductor nanocrystals having an average nanocrystal diameter in a range from about 12 to about 150 Å can be particularly desirable.

However, depending upon the composition and desired emission wavelength of the semiconductor nanocrystal, the average diameter may be outside of these various preferred size ranges.

The semiconductor forming the nanoparticles and nanocrystals for use in the various aspects and embodiments of the inventions described herein can comprise Group IV elements, Group II-VI compounds, Group II-V compounds, Group III-VI compounds, Group III-V compounds, Group IV-VI compounds, Group I-III-VI compounds, Group II-IV-VI compounds, or Group II-IV-V compounds, for example, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys.

Examples of the shape of the nanoparticles and nanocrystals include sphere, rod, disk, other shape or mixtures thereof.

In certain preferred aspects and embodiments of the inventions, quantum confined semiconductor nanoparticles (including, e.g., semiconductor nanocrystals) include a "core" of one or more first semiconductor materials, which may include an overcoating or "shell" of a second semiconductor material on at least a portion of a surface of the core. In certain embodiments, the shell surrounds the core. A quantum confined semiconductor nanoparticle (including, e.g., semiconductor nanocrystal) core including a shell on at least a portion of a surface of the core is also referred to as a "core/shell" semiconductor nanocrystal.

For example, a quantum confined semiconductor nanoparticle (including, e.g., semiconductor nanocrystal) can include a core comprising a Group IV element or a compound represented by the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as a core include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys. Examples of materials suitable for use as a shell include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys.

In certain embodiments, the surrounding "shell" material can have a bandgap greater than the bandgap of the core material and can be chosen so as to have an atomic spacing close to that of the "core" substrate. In another embodiment, the surrounding shell material can have a bandgap less than the bandgap of the core material. In a further embodiment, the shell and core materials can have the same crystal structure. Shell materials are discussed further below. For further examples of core/shell semiconductor structures, see U.S. application Ser. No. 10/638,546, entitled "Semiconductor Nanocrystal Heterostructures", filed 12 Aug. 2003, which is hereby incorporated herein by reference in its entirety.

Quantum confined semiconductor nanoparticles are preferably members of a population of semiconductor nanoparticles having a narrow size distribution. More preferably, the quantum confined semiconductor nanoparticles (including, e.g., semiconductor nanocrystals) comprise a monodisperse or substantially monodisperse population of nanoparticles.

Quantum confined semiconductor nanoparticles show strong quantum confinement effects that can be harnessed in designing bottom-up chemical approaches to create optical properties that are tunable with the size and composition of the nanoparticles.

For example, preparation and manipulation of semiconductor nanocrystals are described in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 entitled "Highly Luminescent Color-selective Materials" which are hereby incorporated herein by reference in their entireties. Other examples of the preparation and manipulation of semiconductor nanocrystals are described in U.S. Pat. Nos. 6,322,901 and 6,576,291, and U.S. Patent Application No. 60/550,314, each of which is hereby incorporated herein by reference in its entirety.

Other materials, techniques, methods, applications, and information that may be useful with the present invention are described in U.S. patent application Ser. No. 11/354,185 of Bawendi et al., entitled "Light Emitting Devices Including Semiconductor Nanocrystals", filed 15 Feb. 2006; U.S. patent application Ser. No. 11/253,595 of Coe-Sullivan et al., entitled "Light Emitting Device Including Semiconductor Nanocrystals", filed 21 Oct. 2005; U.S. patent application Ser. No. 10/638,546 of Kim et al., entitled "Semiconductor Nanocrystal Heterostructures", filed 12 Aug. 2003, referred to above; Murray, et al., J. Am. Chem. Soc., Vol. 115, 8706 (1993); Kortan, et al., J. Am. Chem. Soc., Vol. 112, 1327 (1990); and the Thesis of Christopher Murray, "Synthesis and Characterization of II-VI Quantum Dots and Their Assembly into 3-D Quantum Dot Superlattices", Massachusetts Institute of Technology, September, 1995, U.S. Application No. 60/971,887 of Breen, et al., for "Functionalized Semiconductor Nanocrystals And Method", filed 12 Sep. 2007, U.S. Application No. 60/866,822 of Clough, et al., for "Nanocrystals Including A Group IIIA Element And A Group VA Element, Method, Composition, Device and Other Products", filed 21 Nov. 2006; U.S. Provisional Patent Application No. 60/866,828 of Craig Breen et al., for "Semiconductor Nanocrystal Materials And Compositions And Devices Including Same," filed 21 Nov. 2006; U.S. Provisional Patent Application No. 60/866,832 of Craig Breen et al. for "Semiconductor Nanocrystal Materials And Compositions And Devices Including Same," filed 21 Nov. 2006; U.S. Provisional Patent Application No. 60/866,833 of Dorai Ramprasad for "Semiconductor Nanocrystal And Compositions And Devices Including Same" filed 21 Nov. 2006; U.S. Provisional Patent Application No. 60/866,834 of Dorai Ramprasad for "Semiconductor Nanocrystal And Compositions And Devices Including Same," filed 21 Nov. 2006; U.S. Provisional Patent Application No. 60/866,839 of Dorai Ramprasad for "Semiconductor Nanocrystal And Compositions And Devices Including Same" filed 21 Nov. 2006; U.S. Provisional Patent Application No. 60/866,843 of Dorai Ramprasad for "Semiconductor Nanocrystal And Compositions And Devices Including Same," filed 21 Nov. 2006, and U.S. Patent Application No. 60/050,929 of Seth Coe-Sullivan et al. for "Optical Components, Systems Including an Optical Component, And Devices", filed 6 May 2008. Each of the foregoing is hereby incorporated by reference herein in its entirety.

In various aspects and embodiments of the invention, quantum confined semiconductor nanoparticles (including, but not limited to, semiconductor nanocrystals) optionally have ligands attached thereto.

In certain embodiments, the ligands are derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a suspension or dispersion medium. Such affinity improves the stability of the suspension and discourages flocculation of the semiconductor nanocrystal. In other embodiments, semiconductor nanocrystals can alternatively be prepared with use of non-coordinating solvent(s).

For example, a coordinating ligand can have the formula:

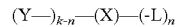

wherein k is 2, 3 or 5, and n is 1, 2, 3, 4 or 5 such that k-n is not less than zero; X is O, S, S=O, SO2, Se, Se=O, N, N=O, P, P=O, As, or As=O; each of Y and L, independently, is aryl, heteroaryl, or a straight or branched C2-12 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

A suitable coordinating ligand can be purchased commercially or prepared by ordinary synthetic organic techniques, for example, as described in J. March, Advanced Organic Chemistry, which is incorporated herein by reference in its entirety.

See also U.S. patent application Ser. No. 10/641,292 entitled "Stabilized Semiconductor Nanocrystals", filed 15 Aug. 2003, which is hereby incorporated herein by reference in its entirety.

When an electron and hole localize on a quantum confined semiconductor nanoparticle (including, but not limited to, a semiconductor nanocrystal), emission can occur at an emission wavelength. The emission has a frequency that corresponds to the band gap of the quantum confined semiconductor material. The band gap is a function of the size of the nanoparticle. Quantum confined semiconductor nanoparticle s having small diameters can have properties intermediate between molecular and bulk forms of matter. For example, quantum confined semiconductor nanoparticles having small diameters can exhibit quantum confinement of both the electron and hole in all three dimensions, which leads to an increase in the effective band gap of the material with decreasing crystallite size. Consequently, for example, both the optical absorption and emission of semiconductor nanocrystals shift to the blue, or to higher energies, as the size of the crystallites decreases.

For an example of blue light-emitting semiconductor nanocrystal materials, see U.S. patent application Ser. No. 11/071,244, filed 4 Mar. 2005, which is hereby incorporated by reference herein in its entirety.

The emission from a quantum confined semiconductor nanoparticle can be a narrow Gaussian emission band that can be tuned through the complete wavelength range of the ultraviolet, visible, or infra-red regions of the spectrum by varying the size of the quantum confined semiconductor nanoparticle, the composition of the quantum confined semiconductor nanoparticle, or both. For example, CdSe can be tuned in the visible region and InAs can be tuned in the infra-red region. The narrow size distribution of a population of quantum confined semiconductor nanoparticles can result in emission of light in a narrow spectral range. The population can be monodisperse preferably exhibits less than a 15% rms (root-mean-square) deviation in diameter of the quantum confined semiconductor nanoparticle s, more preferably less than 10%, most preferably less than 5%. Spectral emissions in a narrow range of no greater than about 75 nm, preferably 60 nm, more preferably 40 nm, and most preferably 30 nm full width at half max (FWHM) for quantum confined semiconductor nanoparticle s that emit in the visible can be observed. IR-emitting quantum confined semiconductor nanoparticle s can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of quantum confined semiconductor nanoparticle diameters decreases.

For example, semiconductor nanocrystals can have high emission quantum efficiencies such as greater than 10%, 20%, 30%, 40%, 50%, 60%, 70%, 80%, or 90%.

The narrow FWHM of semiconductor nanocrystals can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A pattern including more than one size of semiconductor nanocrystal can emit light in more than one narrow range of wavelengths. The color of emitted light perceived by a viewer can be controlled by selecting appropriate combinations of semiconductor nanocrystal sizes and materials. The degeneracy of the band edge energy levels of semiconductor nanocrystals facilitates capture and radiative recombination of all possible excitons.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

Quantum confined semiconductor nanoparticles are preferably handled in a controlled (oxygen-free and moisture-free) environment, preventing the quenching of luminescent efficiency during the fabrication process.

An optical material comprising luantum confined semiconductor nanoparticles can be dispersed in a liquid medium and are therefore compatible with thin-film deposition techniques such as spin-casting, drop-casting, and dip coating.

In certain preferred embodiments, an optical material for use in various aspects and embodiments in accordance with the invention can be prepared, for example, from an ink comprising quantum confined semiconductor nanoparticles and a liquid vehicle, wherein the liquid vehicle comprises one or more functional groups that are capable of being polymerized (e.g., cross-linked) to form a host material. In certain embodiments, the functional units can be cross-linked by UV treatment. In certain embodiments, the functional units can be cross-linked by thermal treatment. In certain embodiments, the functional units can be cross-linked by other cross-linking technique readily ascertainable by a person of ordinary skill in a relevant art. In certain embodiments, the optical material including one or more functional groups that are capable of being cross-linked can be the liquid vehicle itself. See also U.S. Application No. 60/946,090 of Linton, et al., for "Methods For Depositing Nanomaterial, Methods For Fabricating A Device, Methods For Fabricating An Array Of Devices And Compositions", filed 25 Jun. 2007, and U.S. Application No. 60/949,306 of Linton, et al., for "Compositions, Methods For Depositing Nanomaterial, Methods For Fabricating A Device, And Methods For Fabricating An Array Of Devices", filed 12 Jul. 2007, the disclosures of each of which are hereby incorporated herein by reference. Optionally, the ink further includes scatterers and/or other additives.

An ink can be deposited onto a surface of a substrate by printing, screen-printing, spin-coating, gravure techniques, inkjet printing, roll printing, etc. The ink can be deposited in a predetermined arrangement. For example, the ink can be deposited in a patterned or unpatterned arrangement. For additional information that may be useful to deposit an ink onto a substrate, see for example, International Patent Application No. PCT/US2007/014711, entitled "Methods For Depositing Nanomaterial, Methods For Fabricating A Device, And Methods For Fabricating An Array Of Devices", of Seth A. Coe-Sullivan, filed 25 Jun. 2007, International Patent Application No. PCT/US2007/014705, entitled "Methods For Depositing Nanomaterial, Methods For Fabricating A Device, Methods For Fabricating An Array Of Devices And Compositions", of Seth A. Coe-Sullivan, et al., filed 25 Jun. 2007, International Patent Application No. PCT/US2007/014706, entitled "Methods And Articles Including Nanomaterial", of Seth A. Coe-Sullivan, et al., filed 25 Jun. 2007, International Patent Application No. PCT/US2007/08873, entitled "Composition Including Material, Methods Of Depositing Material, Articles Including Same And Systems For Depositing Material", of Seth A. Coe-Sullivan, et al., filed 9 Apr. 2007, International Patent Application No. PCT/US2007/09255, entitled "Methods Of Depositing Material, Methods Of Making A Device, And Systems And Articles For Use In Depositing Material", of Maria J, Anc, et al., filed 13 Apr. 2007, International Patent Application No. PCT/US2007/08705, entitled "Methods And Articles Including Nanomaterial", of Seth Coe-Sullivan, et al, filed 9 Apr. 2007, International Patent Application No. PCT/US2007/08721, entitled "Methods Of Depositing Nanomaterial & Methods Of Making A Device" of Marshall Cox, et al., filed 9 Apr. 2007, U.S. patent application Ser. No. 11/253,612, entitled "Method And System For Transferring A Patterned Material" of Seth Coe-Sullivan, et al., filed 20 Oct. 2005, and U.S. patent application Ser. No. 11/253,595, entitled "Light Emitting Device Including Semiconductor Nanocrystals", of Seth Coe-Sullivan, et al., filed 20 Oct. 2005, each of the foregoing patent applications being hereby incorporated herein by reference.

Due to the positioning of the optical material comprising quantum confined semiconductor nanoparticles in features or layers resulting from these deposition techniques, not all of the surfaces of the nanoparticles may be available to absorb and emit light.

In certain embodiments, an optical material comprising quantum confined semiconductor nanoparticles can be deposited on a surface using contact printing. See, for example, A. Kumar and G. Whitesides, *Applied Physics Letters*, 63, 2002-2004, (1993); and V. Santhanam and R. P. Andres, *Nano Letters*, 4, 41-44, (2004), each of which is incorporated by reference in its entirety. See also U.S. patent application Ser. No. 11/253,612, filed 21 Oct. 2005, entitled "Method And System For Transferring A Patterned Material", of Coe-Sullivan et al. and U.S. patent application Ser. No. 11/253,595, filed 21 Oct. 2005, entitled "Light Emitting Device Including Semiconductor Nanocrystals," of Coe-Sullivan, each of which is incorporated herein by reference in its entirety.

This technique can be use for depositing a various thicknesses of optical materials comprising quantum confined semiconductor nanoparticles. In certain embodiments the thickness is selected to achieve the desired % absorption thereby. Most preferably, the quantum confined semiconductor nanoparticles do not absorb any, or absorb only negligible amounts of, the re-emitted photons.

In certain embodiments, methods for applying a material (e.g., an optical material) to a predefined region on a substrate (e.g., support element) may be desirable. The predefined region is a region on the substrate where the material is selectively applied. In certain embodiments wherein the optical component includes one or more different types of quantum confined semiconductor nanoparticles to compensate for more than one spectral deficiency of a light source, different types of quantum confined semiconductor nanoparticle can optionally be included in one or more different optical materials. In certain embodiments wherein the optical component includes one or more different types of quantum confined semiconductor nanoparticles to compensate for more than one spectral deficiency of a light source, different types of quantum confined semiconductor nanoparticle can optionally be included in two or more different optical materials, and each of the different optical materials can be applied to different regions of the substrate and/or as separate layers over the substrate. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material.

An optical material comprising quantum confined semiconductor nanoparticles can alternatively be deposited by solution based processing techniques, phase-separation, spin casting, inkjet printing, silk-screening, and other liquid film techniques available for forming patterns on a surface.

Alternatively, quantum confined semiconductor nanoparticles can be dispersed in a light-transmissive host material (e.g., a polymer, a resin, a silica glass, or a silica gel, etc., which is preferably at least partially light-transmissive, and more preferably transparent, to the light emitted by the quantum confined semiconductor nanoparticles and in which quantum confined semiconductor nanoparticles can be dispersed) that is deposited as a full or partial layer or in a patterned arrangement by any of the above-listed or other known techniques. Suitable materials include many inexpensive and commonly available materials, such as polystyrene, epoxy, polyimides, and silica glass. After application to the surface, such material may contain a dispersion of quantum confined semiconductor nanoparticles where the nanoparticles have been size selected so as to produce light of a given color. Other configurations of quantum confined semiconductor nanoparticles disposed in a material, such as, for example, a two-dimensional layer on a substrate with a polymer overcoating are also contemplated.

U.S. Patent Application No. 61/016,227 of Seth Coe-Sullivan et al. for "Compositions, Optical Component, System Including An Optical Components, and Devices", filed 21 Dec. 2007 is hereby incorporated herein by reference in its entirety.

As used herein, "top", "bottom", "over", and "under" are relative positional terms, based upon a location from a reference point. More particularly, "top" means farthest away from a reference point, while "bottom" means closest to the reference point. Where, e.g., a layer is described as disposed or deposited "over" a component or substrate, the layer is disposed farther away from the component or substrate. There may be other layers between the layer and component or substrate. As used herein, "cover" is also a relative position term, based upon a location from a reference point. For example, where a first material is described as covering a second material, the first material is disposed over, but not necessarily in contact with the second material.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:

1. An endoscopy light source comprising a solid state lighting device comprising a phosphor converted LED light source that emits white light including a blue spectral component and having a deficiency in at least one spectral region, and an optical component that is positioned to receive at least a portion of the light generated by the phosphor-converted LED light source and supplement the spectrum of the white light passing through the optical component, the optical component comprising an optical material for converting at least a portion of the blue spectral component of the white light to one or more predetermined wavelengths such that light emitted by the solid state lighting device includes white light emission from the phosphor-converted LED light source supplemented with light emission at the one or more predetermined wavelengths in the at least one deficient spectral region of the phosphor-converted LED light source, wherein the optical material comprises quantum confined semiconductor nanocrystals distributed in a light-transmissive solid host material, wherein the optical material is fully encapsulated by one or more barrier materials, wherein the optical component is not in direct contact with the phosphor-converted LED light source, wherein the at least one predetermined wavelength comprises a wavelength in a range from about 575 nm to about 650 nm,
wherein the quantum confined semiconductor nanocrystal comprises a Group II-VI compound, a Group II-V compound, a Group III-VI compound, a Group III-V compound, a Group IV-VI compound, a Group I-III-VI compound, a Group II-IV-VI compound, or a Group II-IV-V compound, and wherein the light emitted by the sold state lighting device has a General Color Rendering Index (Ra) greater than 80.

2. An endoscopy light source in accordance with claim 1 wherein at least one predetermined wavelength further comprises a wavelength in a range from about 450 nm to about 500 nm.

3. An endoscopy light source in accordance with claim 1 wherein the light emitted by the solid state lighting device has a General Color Rendering Index (Ra) greater than 90.

4. An endoscopy light source in accordance with claim 1 wherein the light emitted by the solid state lighting device has a General Color Rendering Index (Ra) greater than 95.

5. An endoscopy light source in accordance with claim 1 wherein the General Color Rendering Index (Ra) of the light emitted by the solid state lighting device is at least 10% higher than the General Color Rendering Index (Ra) of the light emitted by the phosphor-converted LED light source.

6. An endoscopy light source in accordance with claim 1 wherein the solid state lighting device maintains greater than 70% of the phosphor-converted LED light source lumens per watt efficiency.

7. An endoscopy light source in accordance with claim 1 wherein lumens per watt efficiency of the solid state lighting device does not substantially vary as a function of the color temperature of the solid state lighting device.

8. An endoscopy light source in accordance with claim 1 wherein quantum confined semiconductor nanocrystals are included in the optical material in an amount in a range from about 0.001 to about 5 weight percent of the weight of the host material.

9. An endoscopy light source in accordance with claim 1 wherein the optical material further comprises light scatterers.

10. An endoscopy light source in accordance with claim 9 wherein light scattering particles are included in the optical material in an amount in a range from about 0.001 to about 5 weight percent of the weight of the host material.

11. An endoscopy light source in accordance with claim 1 wherein the optical material comprising quantum confined semiconductor nanocrystals are disposed over a surface of a support element.

12. An endoscopy light source in accordance with claim 1 wherein the temperature at the location of the nanocrystals during operation of the solid state lighting device is less than 90° C.

13. An endoscopy light source in accordance with claim 1 wherein optical material comprises quantum confined semiconductor nanocrystals capable of emitting red light.

14. An endoscopy light source in accordance with claim 1 wherein the solid host material comprises at least one of polymers, monomers, resins, binders, glasses, metal oxides, nonpolymeric materials, and silica gels.

15. An endoscopy light source in accordance with claim 1 wherein the semiconductor nanocrystal includes a core comprising a first semiconductor material and a shell comprising a second semiconductor material on at least a portion of a surface of the core, the first semiconductor material is different from the second semiconductor material.

16. A method for improving lumens per watt efficiency of a white light emitting solid state semiconductor light emitting device having a spectral output including emissions in the blue and yellow spectral regions, the method comprising:
passing at least a portion of the blue emission into an optical material to convert at least a portion of the blue spectral emission into one or more emissions in an orange to red spectral region, the optical material comprising quantum confined semiconductor nanocrystals distributed in a light transmissive solid host material, wherein the orange to red spectral region is in a range from about 575 nm to about 650 nm,
wherein the quantum confined semiconductor nanocrystal comprises a Group II-VI compound, a Group II-V compound, a Group III-VI compound, a Group III-V compound, a Group IV-VI compound, a Group I-III-VI compound, a Group II-IV-VI compound, or a Group II-IV-V compound, and wherein the light emitted by the solid state lighting device has a General Color Rendering Index (Ra) greater than 80.

17. A solid state lighting device, comprising:

a phosphor converted LED light source that emits white light including a blue spectral component and having a deficiency in at least one spectral region and an optical component that is positioned to receive at least a portion of the white light generated by the light source and supplement the spectrum of the white light passing through the optical component, the optical component comprising an optical material for converting at least a portion of the blue spectral component of the white light to one or more predetermined wavelengths such that light emitted by the solid state lighting device includes white light emission from the light source supplemented with light emission at the one or more predetermined wavelengths in the at least one deficient spectral region of the light source, wherein the optical material comprises quantum confined semiconductor nanocrystals distributed in a light transmissive solid host material and wherein the optical component comprises the optical material sandwiched between two barrier films or coatings, wherein at least one predetermined wavelength is in a range from about 575 nm to about 650 nm, wherein the quantum confined semiconductor nanocrystal comprises a Group II-VI compound, Group II-V compound, at Group III-VI compound, a Group III-V compound, a Group IV-VI compound, a Group I-III-VI compound, a Group II-IV-VI compound, or a Group II-IV-V compound, and wherein the light emitted by the solid state lighting device has a General Color Rendering Index (Ra) greater than 80.

18. A solid state lighting device in accordance with claim 17 wherein quantum confined semiconductor nanocrystals are included in the optical material in an amount in a range from about 0.001 to about 5 weight percent of the weight of the host material.

19. A solid state lighting device in accordance with claim 17 wherein the optical material further comprises light scatterers.

20. A solid state lighting device in accordance with claim 19 wherein light scattering particles are included in the optical material in an amount in a range from about 0.001 to about 5 weight percent of the weight of the host material.

\* \* \* \* \*